United States Patent [19]
Arya et al.

[11] Patent Number: 5,403,404
[45] Date of Patent: * Apr. 4, 1995

[54] MULTIJUNCTION PHOTOVOLTAIC DEVICE AND METHOD OF MANUFACTURE

[75] Inventors: Rejeewa R. Arya, Jamison, Pa.; Anthony W. Catalano, Boulder, Colo.; Murray Bennett, Longhorne, Pa.

[73] Assignee: Amoco Corporation, Naperville, Ill.

[*] Notice: The portion of the term of this patent subsequent to Sep. 21, 2010 has been disclaimed.

[21] Appl. No.: 77,769

[22] Filed: Jun. 18, 1993

Related U.S. Application Data

[63] Continuation-in-part of Ser. No. 730,177, Jul. 16, 1991, Pat. No. 5,246,506.

[51] Int. Cl.⁶ .................... H01L 31/05; H01L 31/06
[52] U.S. Cl. ................................................. 136/249
[58] Field of Search ........................... 136/249 TJ

[56] References Cited

U.S. PATENT DOCUMENTS

| | | | |
|---|---|---|---|
| 3,801,879 | 4/1974 | Merrin | 257/2 |
| 3,864,717 | 2/1975 | Merrin | 257/53 |
| 3,864,718 | 2/1975 | Merrin | 257/2 |
| 4,166,918 | 9/1979 | Nostrand et al. | 136/243 |
| 4,167,015 | 9/1979 | Hanak | 136/255 |
| 4,174,561 | 11/1979 | House et al. | 437/2 |
| 4,255,211 | 3/1981 | Fraas | 136/249 TJ |
| 4,272,641 | 6/1981 | Hanak | 136/249 TJ |
| 4,278,474 | 7/1981 | Blakeslee et al. | 136/249 TJ |
| 4,292,092 | 9/1981 | Hanak | 437/2 |
| 4,297,720 | 10/1981 | Nishizawa et al. | 257/189 |
| 4,316,049 | 2/1982 | Hanak | 136/244 |
| 4,320,247 | 3/1982 | Gatos et al. | 136/255 |
| 4,341,918 | 7/1982 | Evans, Jr. et al. | 136/249 MS |
| 4,342,044 | 7/1982 | Ovshinsky et al. | 257/54 |
| 4,352,868 | 10/1982 | Skotheim | 429/111 |
| 4,377,723 | 3/1983 | Dalal | 136/249 TJ |
| 4,387,265 | 6/1983 | Dalal | 136/249 TJ |
| 4,416,959 | 11/1983 | Skotheim | 429/111 |
| 4,442,185 | 4/1984 | Skotheim | 429/111 |
| 4,471,155 | 9/1984 | Mohr et al. | 136/258 AM |

(List continued on next page.)

FOREIGN PATENT DOCUMENTS

| | | | |
|---|---|---|---|
| 60-111478(A) | 6/1985 | Japan | 136/249 TJ |
| 62-84571(A) | 4/1987 | Japan | 136/249 TJ |
| 62-296569(A) | 12/1987 | Japan | 136/249 TJ |

OTHER PUBLICATIONS

Y. Marfaing, *2nd E.C. Photovoltaic Solar Energy Conf.*, Berlin, 1979, pp. 287–294.

"Improving Tunneling Junction In Amorphous Silicon Tandem Solar Cells," D. S. Shen et al., Appl. Phys. Lett. 56 (19), 7 May 1990, pp. 1871–1873.

"A Stable 10% Solar Cell With a-Si/a-Si Double-Junction Structure," Yukimi Ichikawa et al., Conf. Record of the IEEE Photovoltaic Specialists Conference, vol. 21, IEEE, pp. 1475–1480 (1990).

"Stacked Solar Cells of Amorphous Silicon," J. J. Hanak, Journal of Non-Crystalline Solids 35 & 36 (1980), pp. 755–759.

*Primary Examiner*—Aaron Weisstuch

[57] ABSTRACT

A multijunction photovoltaic device includes first, second, and third amorphous silicon p-i-n photovoltaic cells in a stacked arrangement. The intrinsic layers of the second and third cells are formed of a-SiGe alloys with differing ratios of Ge such that the bandgap of the intrinsic layers respectively decrease from the first uppermost cell to the third lowermost cell. An interface layer, composed of a doped silicon compound, is disposed between the two cells and has a lower bandgap than the respective n- and p-type adjacent layers of the first and second cells. The interface layer forms an ohmic contact with the one of the adjacent cell layers of the same conductivity type, and a tunnel junction with the other of the adjacent cell layers.

58 Claims, 6 Drawing Sheets

U.S. PATENT DOCUMENTS

| | | | |
|---|---|---|---|
| 4,479,027 | 10/1984 | Todorof | 136/249 TJ |
| 4,479,028 | 10/1984 | Sato et al. | 136/249 TJ |
| 4,485,125 | 11/1984 | Izu et al. | 427/74 |
| 4,492,810 | 1/1985 | Ovshinsky et al. | 136/255 |
| 4,502,225 | 3/1985 | Lin | 33/18 R |
| 4,513,168 | 4/1985 | Borden | 136/244 |
| 4,575,576 | 3/1986 | Ludowise | 136/249 TJ |
| 4,609,771 | 9/1986 | Guha et al. | 136/249 TJ |
| 4,633,031 | 12/1986 | Todorof | 136/249 TJ |
| 4,642,413 | 2/1987 | Ovshinsky | 136/249 TJ |
| 4,643,817 | 2/1987 | Appleby | 204/242 |
| 4,713,492 | 12/1987 | Hanak | 136/245 |
| 4,713,493 | 12/1987 | Ovshinsky | 136/249 TJ |
| 4,776,894 | 10/1988 | Watanabe et al. | 136/249 TJ |
| 4,891,074 | 1/1990 | Ovshinsky et al. | 136/249 TJ |
| 4,926,230 | 5/1990 | Yamagishi et al. | 136/249 TJ |
| 5,246,506 | 9/1993 | Arya et al. | 136/249 TJ |

MULTIJUNCTION PHOTOVOLTAIC DEVICE AND METHOD OF MANUFACTURE

CROSS REFERENCE TO RELATED APPLICATION

This application is a continuation-in-part of U.S. patent application Ser. No. 07/730,177, filed on Jul. 16, 1991, now U.S. Pat. No. 5,246,506, the content of which is relied upon and incorporated by reference herein.

BACKGROUND OF THE INVENTION

1. Field of the Invention

The present invention relates in general to multijunction photovoltaic devices and their method of manufacture. More particularly, the present invention relates to amorphous silicon multijunction photovoltaic devices constructed to have improved efficiency and stability.

2. Description of the Related Art

Photovoltaic (PV) devices are used to convert radiation, such as solar, incandescent, or fluorescent radiation, into electrical energy. This conversion is achieved as a result of what is known as the photovoltaic effect. When radiation strikes a photovoltaic device and is absorbed by an active region of the device, pairs of electrons and holes are generated. The electrons and holes are separated by an electric field built into the device.

In accordance with a known construction of solar cells using amorphous silicon, the built-in electric field is generated in a structure consisting of p-type, intrinsic (i-type), and n-type layers (p-i-n) of hydrogenated amorphous silicon (a-Si:H). In photovoltaic cells having this construction, the electron-hole pairs are produced in the intrinsic layer of the cell when radiation of the appropriate wavelength is absorbed. The separation of the electrons and holes occurs under the influence of the built-in electric field, with the electrons flowing toward the region of n-type conductivity and the holes flowing toward the region of p-type conductivity. This flow of electrons and holes creates the photovoltage and photocurrent of the photovoltaic cell.

It is important that the semiconductor material used for making a photovoltaic device is capable of absorbing and converting to useful electrical energy as much of the incident radiation as possible in order to generate a high yield of electrons and holes. In this regard, amorphous silicon is a desirable material for use in photovoltaic devices since it is capable of absorbing a high percentage of the incident radiation relative to other materials used in the construction of photovoltaic cells, such as polycrystalline silicon. In fact, amorphous silicon is capable of absorbing about 40% more of incident radiation than polycrystalline silicon.

In a p-i-n type amorphous silicon photovoltaic cell as presently known in the art, the undoped (intrinsic or i-type) layer between the p-type layer and the n-type layer is proportionally much thicker than the p-type and n-type layers. The intrinsic layer serves to prevent the radiation-generated electrons and holes from recombining before they can be separated by the built-in electric field. This structure is generally referred to as "p-i-n" if the radiation is incident on a p-type layer, and "n-i-p" if the radiation is incident on an n-type layer.

Some of the incident light is also absorbed by the doped layers (the p-layers and the n-layers). Because the carriers generated in these layers have an extremely short carrier lifetime, they recombine before they can be collected. Hence, absorption in the doped layers does not contribute to the photocurrent of the photovoltaic cell and a minimization of absorption in doped layers enhances the short-circuit current of p-i-n photovoltaic cells. Absorption loss in the p-layer is a function of the bandgap of the p-layer. Thus, by adjusting the bandgap of the p-layer, the absorption loss in the p-layer can be minimized by including in the p-layer a bandgap widening material such as carbon, nitrogen, oxygen or fluorine. For example, the p-layer can be provided as hydrogenated amorphous silicon carbide (a-SiC:H) with p-type doping.

However, the addition of bandgap widening material to the p-layer increases its resistance. Therefore the amount of bandgap widening material that is added is usually limited by the amount of resistance considered tolerable in the device.

The n-type layer functions to form a rectifying junction with the intrinsic layer. In order to enhance this function, it is desirable to provide the n-layer with a high conductivity. However, it is also desirable to provide the n-layer with a wide optical bandgap since, as described above, carriers generated therein do not contribute to the photocurrent of the cell. Unfortunately, as is the case of the p-layer, the addition to the n-layer of any of the bandgap widening elements described above results in an increase in the resistance of the n-layer. Therefore, the n-layer is typically provided with a concentration of a bandgap widening element that is limited by the amount of resistance considered tolerable in the device.

It is desirable to increase the total number of photons of differing energy and wavelength which are absorbed in order to maximize the photocurrent output of a photovoltaic device. One technique for increasing photon absorption, and thereby increase device efficiency, is to provide a multijunction photovoltaic device with two or more photovoltaic cells arranged in a stacked configuration, i.e., one on top of the other. Such multijunction photovoltaic devices, also known in the art as a tandem junction solar cell, are disclosed in U.S. Pat. No. 4,272,641 issued to Hanak (the '641 patent) and U.S. Pat. No. 4,891,074 issued to Ovshinsky and Adler, which are incorporated herein by reference. In particular, these patents teach the construction of tandem junction amorphous silicon solar cells, wherein each cell has the above described p-i-n structure.

Such multijunction photovoltaic devices consist of a stack of two or more photovoltaic cells which are both electrically and optically in series. Typically in such devices, short wavelength light is absorbed in a first, topmost cell, and longer wavelength light is absorbed in second and, if present, subsequent cells. The first, second and subsequent photovoltaic cells of the multijunction device preferably respectively have successively narrower optical bandgaps in order to efficiently absorb solar radiation.

In order for such multijunction p-i-n photovoltaic devices to operate at maximum efficiency, current must flow unimpeded from each photovoltaic cell to the next adjacent cell in the stack of cells. However, the nature of the multijunction p-i-n photovoltaic device, i.e., p-i-n-p-i-n . . . , results in an n-p junction occurring at each interface between adjacent p-i-n cells and therefore in series electrically with those adjacent cells. Disadvantageously, each of these n-p junctions represents a diode having a polarity opposite to that of the photovoltage generated by each of the adjacent photovoltaic cells. The n-p junctions are non-linear elements that oppose the flow of photocurrent and thereby impose a substantial power loss on the device.

FIG. 1 illustrates a plot of current vs. voltage (IV) of a multijunction p-i-n photovoltaic device. In particular, curve 100 (broken line) represents the IV characteristic for such a photovoltaic device in which no steps have been taken to overcome the adverse effect of the n-p junctions at the interfaces between adjacent cells. As illustrated by curve 100, an inflection occurs in the region where the photocurrent of the device changes direction. Such an inflection represents an undesirable increase in the series resistance of the device due to the n-p junction. This aspect of the IV curve, characteristic of the n-p junction, limits the amount of photocurrent that can be conducted by the photovoltaic device, and therefore lowers the fill factor and power generation capability of the device. As used herein, the fill factor of a photovoltaic device is the ratio $V_{mp}I_{mp}/I_L V_{OC}$, where $V_{mp}$ and $I_{mp}$ are respectively the voltage and current at maximum power delivery of the device, and $V_{OC}$ and $I_L$ are respectively the maximum voltage and current achievable in the device.

A solution to the above described problem caused by the n-p junctions is to modify the structure of the multijunction device so that the junction occurring between each pair of adjacent cells performs like a tunnel junction (i.e., a recombination junction). One known method for creating a tunnel junction between adjacent solar cells of a multijunction photovoltaic device constructed from crystalline semiconductor materials, such as silicon, is to heavily dope the respective n- and p-layers of the n-p junction formed by the adjacent cells. However, this method for creating a tunnel junction cannot readily be applied to the above described multijunction p-i-n devices because amorphous silicon is not easily doped to yield a highly conducting film. Such difficulty in achieving suitably high conductivity is particularly the case with wide bandgap alloys such as hydrogenated amorphous silicon carbide (a-SiC:H) and hydrogenated amorphous silicon nitride (a-SiN:H) which are preferred materials for constructing the p- and n-type layers of amorphous silicon p-i-n photovoltaic devices since, as described above, their use tends to maximize the optical transmissivity of each photovoltaic cell of the multijunction device. As a result, an attempt to highly dope the p- and n-layers of an amorphous silicon multijunction p-i-n device constructed with wide bandgap alloys does not achieve a desirable tunnel junction characteristic at the n-p junction between adjacent cells.

A method for creating a tunnel junction between adjacent solar cells of an amorphous silicon multijunction p-i-n device is disclosed in the above-incorporated U.S. Pat. No. 4,272,641. There, an additional tunnel junction layer is disposed between adjacent p-i-n cells, such layer being provided as a cermet incorporating a metal, or as a thin metal layer and a cermet, hereinafter the "metallic layer." While the metallic layer may function in conjunction with the adjacent cell layers to reduce the above described inflection in the IV curve 100 of the device (FIG. 1), the provision of the extra metallic layer substantially inhibits the manufacturing process. In order to manufacture an amorphous silicon multijunction photovoltaic device using such a metallic layer, a first photovoltaic cell is formed in a first material deposition system, for example a glow discharge chamber as described in the '641 patent. Next, the device must be removed from the glow discharge chamber and placed in a second material deposition system where the metallic layer is deposited. For example, the '641 patent describes deposition of the metallic layer by a sputtering process. Then the device must be returned to the first deposition system where a second photovoltaic cell is formed on the metallic layer. Of course, if the device includes more than two cells, the process of transferring between the two deposition systems must be continued. The additional deposition system and the time required to manufacture a multijunction device in accordance with such a process results in an overall increased cost of the device and reduction in production yield.

Further, while the metallic layer disclosed in the '641 patent is optically transmissive, it has a lower index of refraction than that of the adjacent n- and p-type a-Si:H layers of the cells it is disposed between. As a result of the different indexes of refraction, light is undesirably reflected at the interfaces between the metallic layer and the adjacent a-Si:H layers.

As stated above, the most efficient photovoltaic device will absorb all the light which impinges on it and convert the energy from the light into current. However, the total current produced by a multijunction device is equal to the smallest amount of current generated by one of its photovoltaic cells. Therefore, the design of multijunction devices is constricted in the sense that additional photovoltaic cells cannot be arbitrarily added to the device to ensure that all the impinging light is absorbed and converted into current. Because the first photovoltaic cell of a multijunction device absorbs a large portion of the impinging light, the second and subsequent photovoltaic cells typically are constructed with extra thick intrinsic layers in order to maximize the light absorbed and the current produced by the cell. Further, the intrinsic layers of the second and subsequent cells are typically made thicker to compensate for the absorption of light in the p- and n-type layers. Therefore, it has been generally recognized that the overall initial efficiency of such a multijunction device increases with the increase in thickness of the intrinsic layers of the second and subsequent cells.

A problem results, however, in that the photodegradability of a photovoltaic cell increases with increasing thickness of the intrinsic layer used in the photovoltaic cell. Therefore, there is a trade-off between initial efficiency and long term stability of a photovoltaic device.

SUMMARY OF THE INVENTION

The present invention has been made in view of the above circumstances and has as an object to provide an amorphous silicon multijunction photovoltaic device having an increased overall efficiency.

A further object of the present invention is to provide an amorphous silicon multijunction photovoltaic device including a tunnel Junction between adjacent cells which exhibits characteristics that do not limit the power generation of the device.

Another object of the invention is to provide an amorphous silicon multijunction photovoltaic device including a tunnel junction between adjacent cells which may be formed without the need for additional facilities and time to carry out the manufacturing process.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, a multijunction photovoltaic device is provided which comprises a transparent substrate, a transparent electrode formed on the transparent substrate, a first photovoltaic cell formed on the transparent electrode, a second photovoltaic cell, a third photovoltaic cell, a reflective electrode layer formed on the third photovoltaic cell, and an interface layer sandwiched between the first and second photovoltaic cells and/or the second and third photovoltaic cells.

The first photovoltaic cell comprises a p-type layer formed adjacent the transparent electrode, an intrinsic layer of an amorphous semiconductor compound including silicon formed on the p-type layer, and an n-type layer formed on the intrinsic layer.

The second photovoltaic cell comprises a p-type layer, an intrinsic layer formed on the p-type layer, and being made of an amorphous semiconductor compound including silicon doped with germanium and having a bandgap less than the bandgap of the intrinsic layer of the first photovoltaic cell, and an n-type layer formed on the intrinsic layer.

The third photovoltaic cell comprises a p-type layer, an intrinsic layer of an amorphous semiconductor compound including silicon doped with germanium and having a bandgap less than the bandgap of the intrinsic layer of the second photovoltaic cell, and an n-type layer formed on the intrinsic layer.

The interface layer, which is made of a semiconductor compound including silicon, is formed on the n-type layer of the first and/or second photovoltaic cell, and has a bandgap less than the bandgap of the n-type layer of the first and/or second photovoltaic cell and less than the bandgap of the second and/or third photovoltaic cell.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the invention and, together with the description, serve to explain the principles of the invention.

In the drawings.

DETAILED DESCRIPTION OF THE PREFERRED EMBODIMENTS

Reference will now be made in detail to the present preferred embodiments of the invention, examples of which are illustrated in the accompanying drawings.

Figure 2:
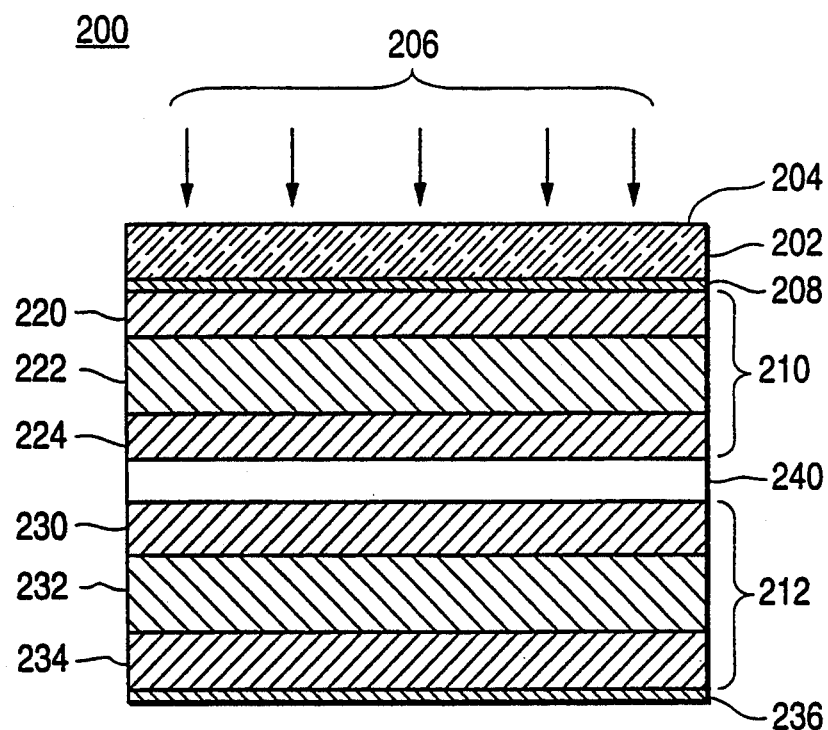
FIG. 2 is a cross-sectional view of an amorphous silicon multijunction photovoltaic device constructed in accordance with a first embodiment of the present invention.

Referring now to FIG. 2, there is shown a multijunction photovoltaic device 200 constructed in accordance with a first embodiment of the invention. Device 200 includes a substrate 202 having an incident surface 204 for receiving radiation 206. Substrate 202 preferably comprises glass or another suitable material which is transparent to the incident radiation. A front conductive contact layer 208 is formed on substrate 202. Front conductive layer 208 is preferably an optically transparent conductor such as a metal oxide, e.g., tin oxide.

Substrate 202 and front conductive contact layer 208 support two photovoltaic cells 210 and 212 in a stacked configuration. Photovoltaic cell 210 is comprised of a p-type hydrogenated amorphous silicon carbide (a-SiC:H) layer 220 deposited on front conductive layer 208, an intrinsic hydrogenated amorphous silicon layer 222 formed on p-type layer 220, and an n-type a-SiC:H layer 224 formed on intrinsic layer 222. Photovoltaic cell 212 has substantially the same basic structure as that of photovoltaic cell 210, in that it is comprised of a p-type a-SiC:H layer 230, an intrinsic hydrogenated amorphous silicon layer 232, and an n-type a-SiC:H layer 234. The p- and n-type layers, of cells 210 and 212, include carbon concentrations of approximately 20% and 15%, respectively, at least adjacent to the intrinsic layer in each cell. A grading of the carbon concentration in each of n-type layer 224 and p-type layer 230 is described more fully below with respect to a method for constructing device 200. It is noted that while both the p- and n-type layers of cells 210 and 212 include carbon, a multijunction device can be constructed in accordance with the invention without including a bandgap widening element in all doped layers.

While the p- and n-type layers of cells 210 and 212 can include carbon as a bandgap widening element, intrinsic layers 222 and 232 are substantially free of such bandgap widening elements. However, narrow portions of the intrinsic layer, respectively in contact with the p- and n-type layers containing carbon, can include a small, graded concentration of carbon. Further, in accordance with a known practice in the art, intrinsic layers 222 and 232 can include light p-type doping, e.g., a concentration of boron of less than $10^{17}$ cm$^{-3}$, which is known to improve carrier generation capability of the intrinsic layer. Exemplary thicknesses and doping concentrations of the layers constituting each cell 210 and 212 are disclosed in the above-incorporated U.S. Pat. No. 4,272,641.

Device 200 also includes a back contact layer 236 formed on n-type layer 234 and preferably provided as a metal such as aluminum.

An interface layer 240 of relatively low bandgap, high conductivity semiconductor material is interposed between the n-type a-SiC:H layer 224 of photovoltaic cell 210 and the p-type a-SiC:H layer 230 of photovoltaic cell 212. In particular, layer 240 has a lower bandgap than either of adjacent layers 224 or 230 and can be provided as a p- or n-type semiconductor material that forms an ohmic contact with the adjacent one of layers 224 and 230 of the same conductivity type and that forms a tunnel junction with the one of layers 224 and 230 of the opposite conductivity type. Since layer 240 has a lower bandgap, it also has a higher electrical conductivity than either of adjacent layers 224 and 230. In general, while layers 224 and 230 can each have a bandgap on the order of 1.9 eV, the bandgap of layer 240 is preferably on the order of less than 1.7 eV.

In accordance with a first variation of the first embodiment, interface layer 240 is provided as a p+-type hydrogenated amorphous silicon layer substantially free of carbon, nitrogen, fluorine or similar bandgap widening elements. Layer 240 so provided preferably has a thickness in the range of 10 Å to 200 Å and preferably approximately 20 Å, and is preferably doped with an acceptor dopant, such as boron, to a concentration of approximately 1%. As a result, layer 240 provided as a p+-type layer forms a highly conductive, ohmic contact with p-type layer 230 of cell 212 and a tunnel junction with n-type layer 224 of cell 210.

In accordance with a second variation of the first embodiment, interface layer 240 is provided as a microcrystalline layer of n+-type hydrogenated silicon that is substantially free of carbon, nitrogen, fluorine or other bandgap widening elements. As used herein, microcrystalline describes a material whose crystalline order is in the range of substantially 25 Å to 500 Å. The presence of microcrystallinity can be determined by one or more of electron diffraction, x-ray diffraction, or Raman scattering spectroscopy. Since doped microcrystalline silicon is an indirect bandgap material having a relatively low bandgap, e.g., approximately 1.1 eV, it provides the dual advantages of high conductivity and high optical transmissivity.

Layer 240 provided as a microcrystalline n+-type layer preferably has a thickness in the range of 15 Å to 50 Å and preferably approximately 50 Å, and is preferably doped with a donor dopant, such as phosphorus, to a concentration of approximately 1%. As a result, layer 240 provided as an n+-type microcrystalline layer forms a highly conductive, ohmic contact with n-type layer 224 of cell 210 and a tunnel junction with p-type layer 230 of cell 212. Layer 240 provided as a microcrystalline layer has a relatively low optical bandgap but retains a high optical transmissivity because it is an indirect optical bandgap material.

While the first embodiment of the present invention can be successfully constructed and practiced with n-type layer 224 of cell 210 provided with a uniform carbon concentration throughout, it is preferred herein that the carbon concentration of layer 224 be graded from a maximum value at the interface with adjacent intrinsic layer 222 to a minimum value, preferably a zero concentration, at the interface with layer 240. Such grading can be achieved by either a stepped or continuous grading of the carbon concentration. As discussed above, carbon is included in n-type layer 224, across all or part of the thickness of layer, in order to increase the optical bandgap of that layer. However, disadvantageously, the presence of carbon decreases the conductivity of each of layers 224 and 230. For this reason, the carbon concentration of layer 224 is preferably graded so that the bandgap and hence the conductivity of layer 224 has a maximum value at the interface with layer 240 and can better form a conductive contact therewith. Further, with respect to the first variation of the first embodiment, the enhanced conductive contact between a graded n-type layer 224 and layer 240 provided as a p+-type layer results in improved performance of the tunnel junction formed therebetween.

It is noted that p-type layer 230 of cell 212 can also be provided with a carbon concentration that is graded, by steps or continuously, from a maximum value at its interface with intrinsic layer 232 to a minimum value, e.g., zero concentration, at the interface with layer 240. Such grading of layer 230 improves its conductive contact with layer 240. However, the present inventors have observed that the open circuit voltage of a cell decreases when the p-layer is graded, while the cell open circuit voltage is not particularly sensitive to grading of the n-layer.

In accordance with a third variation of the first embodiment, n-type layer 224 has a graded carbon concentration. Further, layer 240 consists of a first sublayer of n+-type a-Si:H, adjacent to layer 224, and a second sublayer of microcrystalline n+-type layer. The second sublayer is disposed between the first sublayer and layer 230 of cell 212 and is otherwise as described above with respect to the second variation of the first embodiment. In accordance with this third variation, the a-Si:H n+-type sublayer is substantially free of bandgap widening elements, has a thickness in the range of 10 Å to 100 Å and preferably 15 Å, and is preferably doped with phosphorus to a concentration of approximately 1%.

Figure 1:
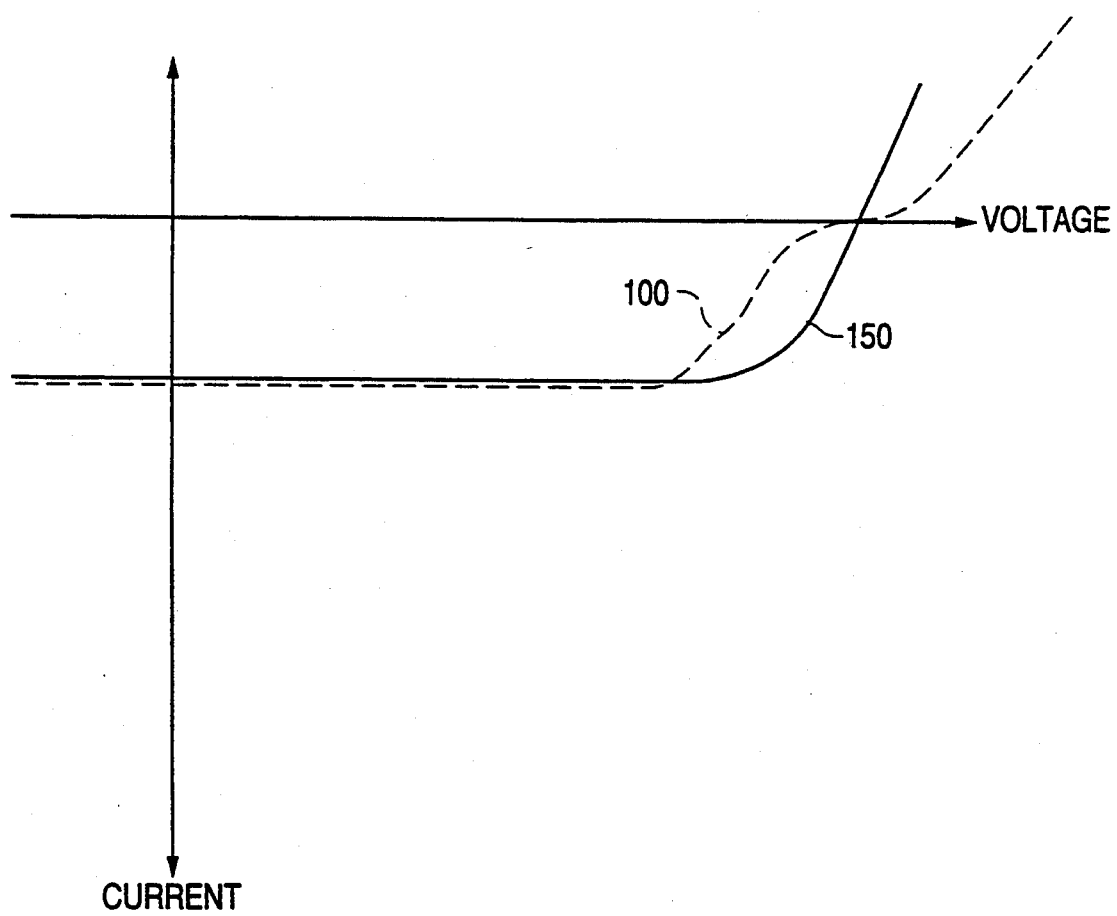
FIG. 1 is a graph of the current-voltage characteristic of a prior art photovoltaic device and the current-voltage characteristic of a preferred embodiment of the claimed invention.

In accordance with the first embodiment, the tunnel junction formed between interface layer 240 and one of layers 224 and 230 functions with a substantially resistive characteristic so that the IV characteristic of device 200 is represented by curve 150 in FIG. 1. Advantageously, as can be seen, curve 150 does not include the inflection found in curve 100. As a result, device 200 constructed to include a tunnel junction in accordance with the first embodiment of the invention, enjoys an improved fill factor and power generation capability.

Also in accordance with the first embodiment, in contrast to the prior art metallic layer described in the above referenced '641 patent, interface layer 240 is comprised of a silicon compound having substantially the same index of refraction as adjacent layers 224 and 230. As a result, device 200 does not experience undesirable reflectivity at the interfaces with layer 240.

Methods for constructing each of the first and second variations of the first embodiment are described next. In this regard, only the formation of layers 224, 230, and 240 are described in detail. A suitable method for constructing the remainder of device 200 is disclosed in the above-incorporated U.S. Pat. No. 4,272,641.

One possible method for constructing device 200 in accordance with the first variation of the first embodiment is described first. All semiconductor layers of device 200 are formed by a glow discharge deposition process. The described method includes a method for providing each of n-type layer 224 and p-type layer 230 with a graded carbon concentration.

First, layer 224 is formed by depositing successively narrower optical bandgap a-SiC alloys by gradually removing carbon during the deposition process. In particular, using silane, 4.5% phosphine in silane and methane, deposition of the wide bandgap portion of n-layer 224, adjacent intrinsic layer 222, begins with a mixture of 125 sccm $PH_3$-$SiH_4$ + 25 sccm $SiH_4$ + 25 sccm methane. Layer 224 is deposited by either dc or rf glow discharge using a power of 0.4 watts/in$^2$ yielding a deposition rate of about 4 Å/second. Two or more layers, or a continuous grading out of carbon, are deposited in succession with the carbon being gradually removed, producing a total thickness of layer 224 of nominally 100 Å. For example, the stepped grading of carbon can be accomplished over three layers. The final gas mixture is 125 sccm $PH_3$-$SiH_4$ + 75 sccm $SiH_4$. Layer 240 provided as a p$^+$-type layer is then deposited by glow discharge to a 20 Å thickness from a mixture of 100 sccm 0.5% diborane-$SiH_4$ + 100 sccm $SiH_4$. Last, p-type a-SiC:H layer 230 is deposited by glow discharge to a thickness of approximately 100 Å. Assuming layer 230 is deposited with a graded optical bandgap, the layer is initially deposited from a mixture of 30 sccm 0.5% diborane-$SiH_4$ + 90 sccm $SiH_4$. Two or more layers, or a continuous grading of carbon, are deposited in succession so that the final mixture from which the layer is deposited includes 80 sccm methane. If the bandgap of layer 230 is not graded, the mixture continuously includes 80 sccm methane. Suitable flushes are provided between depositions to avoid cross contamination. However, the entire fabrication process is carried out with a single glow discharge deposition system.

One possible method for constructing device 200 in accordance with the second variation of the first embodiment is described next. Again, all layers of device 200 are formed by a glow discharge deposition process. In accordance with the method described next, both layers 224 and 230 are provided with a uniform carbon concentration. First, n-type a-SiC:H layer 224 is deposited by dc or rf discharge to a thickness of about 100 Å using 125 sccm 4.5%$PH_3$-$SiH_4$ mixture + 25 sccm $CH_4$ + 75 sccm $SiH_4$ using approximately 0.4 watts/in$^2$ at about 0.5 torr.

Layer 240 as a microcrystalline n-type layer is deposited next. The formation of a microcrystalline doped layer has in the past been difficult to achieve for the extremely thin (10–100 Å) layers required to maintain high optical transmission. This limitation has been overcome by using a high intensity hydrogen glow discharge process to crystallize an amorphous layer which then acts as the "seed" nuclei for the further growth of the crystalline phase. In particular, a 20 Å thick non-carbon containing n-type layer of hydrogenated p-type silicon is deposited using gas flow rates of 125 sccm of 4.5% $PH_3$-$SiH_4$ + 100 sccm $SiH_4$. A 4 second glow discharge deposition at 0.5 torr and 0.4 watts/in$^2$ is used to form the layer. Next, the amorphous deposited layer is recrystallized by using a hydrogen plasma created at 1.5 torr (320 sccm flow rate) for 5 minutes at an rf or dc power level of approximately 2 watts/in$^2$ The microcrystalline n-layer is deposited at 1.5 torr using a 2 watt/in$^2$ glow discharge with a flow rate of 5 sccm of 4.5% $PH_3$ in $SiH_4$ diluted in a 320 sccm flow of pure hydrogen. The deposition is conducted for 50 seconds yielding an approximate thickness of 50 Å. Last, p-type a-SiC layer 230 of cell 212 is deposited for 17 seconds at 0.5 torr from a gas mixture of 25 sccm 0.5% $B_2H_6$ in $SiH_4$ + 80 sccm methane + 100 sccm $SiH_4$ at an rf or dc power level of approximately 0.4 watt/in$^2$.

With respect to the construction of the third variation of the first embodiment, the carbon concentration of layer 224 is graded out in the manner described above. Then, the n$^+$-type a-Si:H sublayer is deposited by a glow discharge to a thickness of approximately 100 Å from a mixture of 125 sccm $PH_3$-$SiH_4$ + 75 sccm $SiH_4$. Next, the n$^+$-type microcrystalline layer and p$^+$-type layer 230 are deposited as described above for the second variation of the first embodiment.

Figure 3:
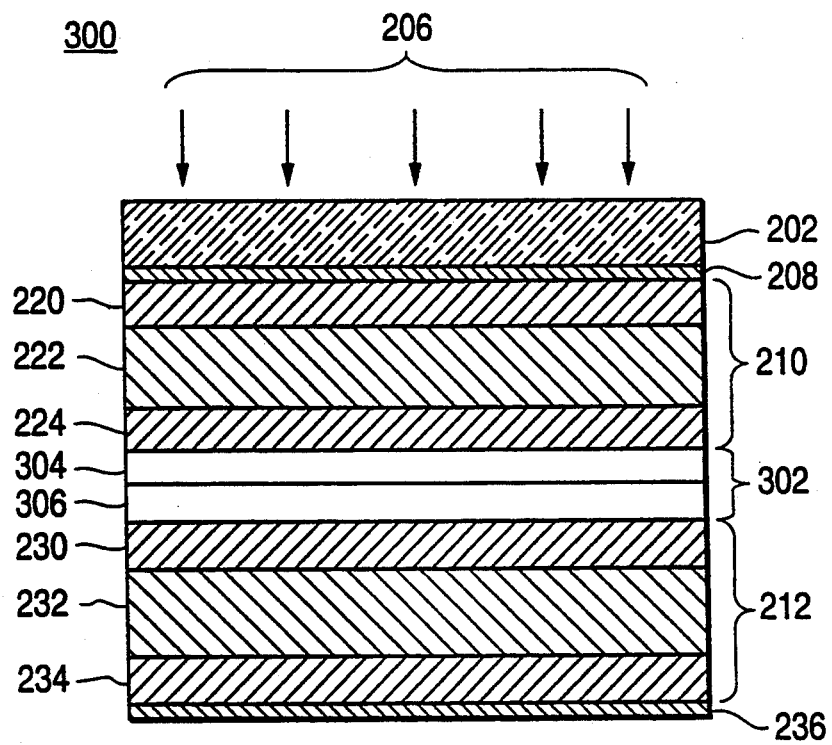
FIG. 3 is a cross-sectional view of an amorphous silicon multijunction photovoltaic device constructed in accordance with a second embodiment of the present invention.

FIG. 3 illustrates a multijunction photovoltaic device 300 constructed in accordance with a second embodiment of the invention. Device 300 includes substrate 202, front conductive layer 208 and photovoltaic cells 210 and 212 as described above for device 200. Device 300 also includes an interface layer 302 comprised of layers 304 and 306 sandwiched between n-type layer 224 of device 210 and p-type layer 230 of device 212 such that layer 304 is in contact with layer 224 and layer 306 is in contact with layer 230. In accordance with several variations of the second embodiment, layers 304 and 306 are respectively provided as n-type and p-type hydrogenated silicon layers each having a relatively low bandgap. In particular, each of layers 304 and 306 has a lower bandgap, and therefore a higher conductivity, than layers 224 and 230. As a result, in accordance with these variations, n-layer 304 forms a highly conductive, ohmic contact with n-type layer 224, p-type layer 306 forms a highly conductive, ohmic contact with p-type layer 230 and a tunnel junction is formed between layers 304 and 306. The bandgap of each of layers 304 and 306 is on the order described above for layer 240 of the first embodiment.

In accordance with a first variation of the second embodiment, layer 304 is provided as a microcrystalline layer of n$^+$-type hydrogenated silicon that is substantially free of carbon, nitrogen, fluorine or other bandgap widening elements. Layer 304 has a thickness in the range of 10 Å to 100 Å and preferably approximately 20 Å, and a dopant concentration of approximately 1%. Layer 306 is provided as a layer of p$^+$-type hydrogenated amorphous silicon that is substantially free of the above noted bandgap widening elements. Layer 306 has a thickness in the range of 5 Å to 100 Å and preferably approximately 15 Å, and a dopant concentration of approximately 1%.

In accordance with a second variation of the second embodiment, layer 304 is provided as a layer of n$^+$-type hydrogenated amorphous silicon that is substantially free of the above-noted bandgap widening elements. Layer 304 so provided has a thickness in the range of 10 Å to 100 Å and preferably approximately 15 Å, and a dopant concentration of approximately 1%. Layer 306 of this variation is the same as described above for the first variation.

In accordance with a third variation of the second embodiment, layer 304 is provided as a microcrystalline layer of n$^+$-type hydrogenated silicon as described above for the first variation. Also in accordance with the third variation, layer 306 is provided as a microcrystalline layer of p$^+$-type hydrogenated silicon that is substantially free of the above-noted bandgap widening elements. In accordance with this variation, layer 306 has a thickness in the range of 10 Å to 100 Å and preferably approximately 15 Å, and a dopant concentration of approximately 1%.

In accordance with a fourth variation of the second embodiment, layer 306 is provided as described for the third variation and layer 304 is provided as described for the second variation.

As in the case of the first embodiment, each variation of the second embodiment can be successfully constructed and practiced with n-type layer 224 and p-type layer 230 each provided with a uniform carbon concentration throughout. However, it is preferred that the carbon concentration of layer 224 be graded as described above with respect to the first embodiment. The carbon concentration of p-layer 230 can also be graded as previously described.

In accordance with the second embodiment of the invention, the tunnel-junction formed between layers 304 and 306 functions with a substantially resistive characteristic so that the IV characteristic of device 300, like device 200, is also represented by curve 150 in FIG. 1. As a result, device 300 constructed in accordance with the second embodiment of the invention enjoys an improved fill factor and power generation capability. Also, as in the case of the first embodiment, layers 304 and 306 are each comprised of a silicon compound having substantially the same index of refraction as layers 224 and 230. As a result, device 300 does not experience undesirable reflectivity at the interfaces with layer 302.

Methods for constructing device 300 are described next. As in the case of the first embodiment, all layers of device 300 are formed by a glow discharge deposition process. With the exception of the microcrystalline p+-type layer included in the third and fourth variations of the second embodiment, the methods described above for constructing layer 240 of the first embodiment provided as p+-type a-Si:H, n+-type microcrystalline silicon, or n+-type a-Si:H, are fully applicable to layers 304 and 306. The p+-type microcrystalline layer 306 of the third and fourth variations can be formed in a manner analogous to that described above for forming the n+-type microcrystalline layer. For example, layer 306 can be deposited from a mixture of 0.5% diborane in silane diluted with 320 sccm hydrogen, by glow discharge with a power of 2 watts/in$^2$.

While devices 200 and 300 constructed in accordance with embodiments of the invention have been described as including carbon in their respective n-type and p-type layers as a bandgap widening element, the invention is not so limited. The invention can be practiced with equal effectiveness using a bandgap widening element other than carbon, e.g., fluorine, nitrogen, or oxygen.

The following example illustrates the advantages realized from constructing a multijunction photovoltaic device to include an interface layer that forms a tunnel junction with an adjacent cell layer. In the example, two multijunction devices, designated device #1 and device #2, were constructed. Both devices #1 and #2 included two p-i-n type photovoltaic cells having characteristics as described above for the illustrated embodiments. Device #1 did not include an interface layer. Device #2 included an interface layer such as described above for the first variation of the first embodiment of the invention. Thus, the interface layer was comprised of a boron doped p+-type hydrogenated amorphous silicon layer substantially free of carbon, nitrogen, fluorine or other bandgap widening elements. In particular, in device #2, the interface layer had a thickness of approximately 20 Å and a boron concentration of approximately 0.3%. Thus, devices #1 and #2 were identical except for the inclusion of the interface layer in device #2.

Table 1 lists performance characteristics of devices #1 and #2 measured under identical irradiation conditions.

TABLE 1

|  | Device #1 | Device #2 |
| --- | --- | --- |
| Voc | 2.141 volts | 2.225 volts |
| Jsc | −6.4 ma/cm$^2$ | −6.5 ma/cm$^2$ |
| Fill Factor | 58.1% | 63.1% |
| Efficiency | 7.9% | 9.2% |
| Rs | 129.16 ohm-cm$^2$ | 54.89 ohm-cm$^2$ |

In Table 1, Voc and Jsc are respectively the open circuit voltage and short circuit current density of the device. As seen in Table 1, the inclusion of the interface layer in device #2 results in an 8.6% increase in fill factor which is reflected by the corresponding increase in device efficiency. As also seen in Table 1, the inclusion of the interface layer in device #2 results in a substantial reduction in the series resistance of the multi junction device.

While devices 200 and 300 each include only two photovoltaic cells, the invention can be practiced with multi junction photovoltaic devices that include more than two cells. In the subsequent embodiments, an interface layer constructed in accordance with either the first or second embodiment of the invention is interposed between one or more of adjacent photovoltaic cells in a multijunction device.

Figure 4:
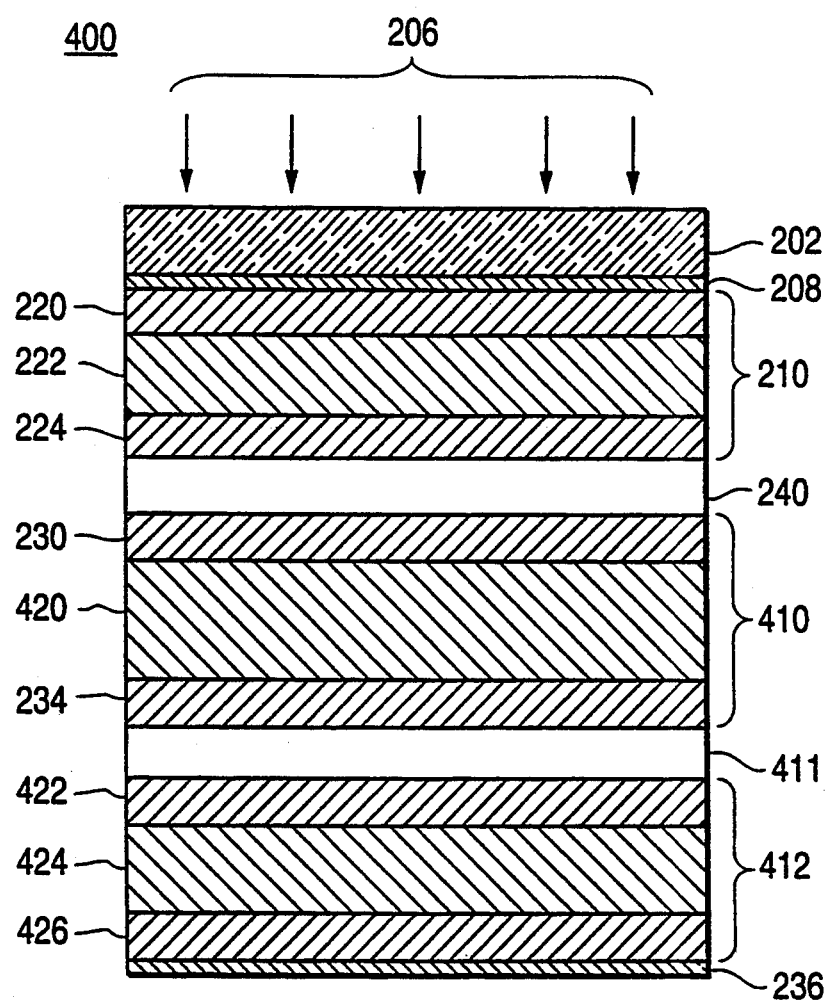
FIG. 4 is a cross-sectional view of an amorphous silicon multijunction photovoltaic device constructed in accordance with a third embodiment of the present invention.

FIG. 4 illustrates a multijunction photovoltaic device 400 constructed in accordance with a third embodiment of the invention. Device 400 includes substrate 202, front conductive layer 208, photovoltaic cell 210, interface layer 240, and back contact layer 236 as described above for devices 200 and 300. Additionally, device 400 includes a second photovoltaic cell 410, and third photovoltaic cell 412, arranged in a stacked configuration and sandwiched between interface layer 240 and back contact layer 236.

Photovoltaic cell 410 has substantially the same basic structure as that of photovoltaic cell 210, in that it is comprised of p-type a-SiC:H layer 230, an intrinsic hydrogenated amorphous silicon layer 420, and an n-type a-SiC:H layer 234. Photovoltaic cell 412 also has substantially the same basic structure as that of photovoltaic cell 210, in that it is comprised of p-type a-SiC:H layer 422, an intrinsic hydrogenated amorphous silicon layer 424, and an n-type a-SiC:H layer 426. The p- and n-type layers, of cells 210, 410, and 412, include carbon concentrations of approximately 20% and 15%, respectively, at least adjacent to the intrinsic layer in each cell. It is noted that while both the p- and n-type layers of cells 210, 410, and 412 include carbon, a multijunction device can be constructed in accordance with the invention without including a bandgap widening element in all doped layers.

While the intrinsic layer 232 of the second photovoltaic cell 212 in the first and second embodiments was described as being substantially free of bandgap widening elements, the intrinsic layer 420 of the second photovoltaic cell 410 in the third embodiment is formed of an a-SiGe alloy in order to alter the bandgap to be lower than that of intrinsic layer 222 of the first photovoltaic cell 210. Similarly, intrinsic layer 424 of the third photovoltaic cell 412 is formed of an a-SiGe alloy having a higher ratio of Ge to silicone than intrinsic layer 420 of the second photovoltaic cell 410 in order to alter the bandgap such that it is lower than that of intrinsic layer 420. For example, if intrinsic layer 222 has a bandgap of approximately 1.73 eV, then intrinsic layer 420 would preferably have a bandgap between 1.45 and 1.65 eV, and intrinsic layer 424 would preferably have a bandgap between 1.20 and 1.45 eV. If intrinsic layer 222 includes a bandgap widening element and has a bandgap of approximately 1.99 eV, then intrinsic layer 420 would preferably have a bandgap between 1.45 and 1.75 eV, and intrinsic layer 424 would preferably have a bandgap between 1.20 and 1.45 eV.

By narrowing the bandgap of the intrinsic layer of each subsequent photovoltaic cell, the cells may be tuned to absorb light of different wavelengths. A drawback to this approach is that, as the bandgap is narrowed, the voltage produced across the cell is lowered. However, such drops in voltage may be compensated for by increases in the photocurrent that are generated by individually tuning each cell to absorb different wave bands of the incident light.

By adding Ge into intrinsic layers 420 and 424 to form a-SiGe alloys having successively lower bandgaps, the efficiency of intrinsic layers 420 and 424 can be increased. Hence, intrinsic layers 420 and 424 may be made thinner without reducing the efficiency of the device. By decreasing the thickness of intrinsic layers 420 and 424, the stability of these layers is increased. Further, since the intrinsic layers of the second and third cells were typically the least stable layers in a multijunction photovoltaic device due to their required thicknesses, the overall stability of the entire photovoltaic device can be improved by introducing Ge into the intrinsic layers of the second and third cells.

Furthermore, by definition, an increase in the stability of the device means that the efficiency of the device does not drop as dramatically over years of use due to photodegradability and the like. Thus, although the initial efficiency of a device having an a-SiGe intrinsic layer may be lowered as a result of making the intrinsic layer thinner, the efficiency of the device after a number of years have passed will actually be greater than a device having a thicker a-Si intrinsic layer.

There are a number of additional benefits of making the intrinsic layers thinner such as: providing a more compact photovoltaic device; using less materials to construct the device; and lowered cost of manufacture. Also, when a photovoltaic device is not very stable, it is necessary to make continued adjustments in the connected circuitry to ensure that a steady level of power is supplied to a consumer. Such adjustments are time consuming and costly. Therefore, by providing a more stable photovoltaic device, time and money can be saved.

In Table 2 below, constructional and performance data of numerous calculated examples of multijunction photovoltaic devices are provided. In constructing the data provided in Table 2, the following assumptions were made: (1) open-circuit voltage $(V_{oc})=0.5\ \Sigma E_g$ (bandgap) and initial fill factor (FF)=0.7, for case numbers 1–6 and 12–26; (2) all materials degrade at the same rate, namely that of a-Si; (3) there is no degradation in $V_{oc}$; and (4) degradation in efficiency is linear with i-layer thickness, 1%/100 Å in 1000 hours. Using the above assumptions and varying the values of the thicknesses and bandgaps of three intrinsic layers, the estimated initial values of short-circuit current (Jsc) and efficiency (Eff) can be calculated. To calculate the final efficiency (Eff), the efficiency of the device is estimated based upon 1000 hours of continuous exposure to white light having an intensity of 100 mW/cm$^2$ which is approximately the intensity of sunlight. This exposure is a good approximation of the effect of deploying the cell outdoors for one year. The rate of photodegradation is strongly dependent on the intensity of the incident radiation and can be approximated from the equation, (time)(intensity)$^{1.8}$=constant.

TABLE 2

| Case # | I$_1$ | | I$_2$ | | I$_3$ | | Initial | | | | Final | | | | Final/Initial |
|---|---|---|---|---|---|---|---|---|---|---|---|---|---|---|---|
| | Eg | T | Eg | T | Eg | T | Voc | FF | Jsc | Eff | Voc | FF | Jsc | Eff | |
| 1 | 1.99 | 2100 | 1.70 | 4000 | 1.40 | 900 | 2.55 | 0.7 | 6.29 | 11.23 | 2.55 | 0.598 | 6.02 | 9.19 | 0.818 |
| 2 | 1.99 | 3000 | 1.55 | 3000 | 1.40 | 3300 | 2.46 | 0.7 | 7.39 | 12.74 | 2.46 | 0.573 | 6.96 | 9.81 | 0.770 |
| 3 | 1.99 | 3600 | 1.55 | 2200 | 1.40 | 2000 | 2.46 | 0.7 | 7.02 | 12.10 | 2.46 | 0.603 | 6.74 | 9.99 | 0.826 |
| 4 | 1.99 | 2200 | 1.70 | 4000 | 1.20 | 250 | 2.45 | 0.7 | 6.4 | 10.99 | 2.45 | 0.600 | 6.15 | 9.04 | 0.823 |
| 5 | 1.99 | 3000 | 1.55 | 2100 | 1.20 | 400 | 2.36 | 0.7 | 7.07 | 11.69 | 2.36 | 0.615 | 6.82 | 9.89 | 0.846 |
| 6 | 1.99 | 3000 | 1.40 | 800 | 1.20 | 450 | 2.30 | 0.7 | 7.08 | 11.44 | 2.30 | 0.627 | 6.86 | 9.90 | 0.865 |
| 7 | 1.73 | 600 | 1.73 | 6000 | 1.40 | 1200 | 2.18 | 0.694 | 6.37 | 10.04 | 2.18 | 0.57 | 5.97 | 7.42 | 0.739 |
| 8 | 1.73 | 600 | 1.73 | 4000 | 1.40 | 1200 | 2.18 | 0.741 | 5.54 | 9.31 | 2.18 | 0.64 | 5.39 | 7.52 | 0.808 |
| 9 | 1.73 | 600 | 1.68 | 4000 | 1.40 | 1200 | 2.15 | 0.685 | 6.44 | 9.89 | 2.15 | 0.60 | 6.20 | 8.00 | 0.809 |
| 10 | 1.73 | 600 | 1.68 | 3000 | 1.40 | 1200 | 2.15 | 0.724 | 5.82 | 9.44 | 2.15 | 0.63 | 5.67 | 7.68 | 0.813 |
| 11 | 1.73 | 600 | 1.63 | 2500 | 1.40 | 1200 | 2.12 | 0.69 | 6.33 | 9.64 | 2.12 | 0.62 | 6.14 | 8.07 | 0.837 |
| 12 | 1.73 | 950 | 1.55 | 4600 | 1.40 | 7500 | 2.33 | 0.7 | 7.79 | 12.71 | 2.33 | 0.522 | 7.07 | 8.6 | 0.677 |
| 13 | 1.73 | 825 | 1.55 | 3000 | 1.40 | 3500 | 2.33 | 0.7 | 7.4 | 12.08 | 2.33 | 0.601 | 7.09 | 1.92 | 0.821 |
| 14 | 1.73 | 780 | 1.55 | 2750 | 1.40 | 3000 | 2.33 | 0.7 | 7.29 | 11.9 | 2.33 | 0.611 | 7.04 | 10.02 | 0.842 |
| 15 | 1.73 | 750 | 1.55 | 2500 | 1.40 | 2500 | 2.33 | 0.7 | 7.17 | 11.69 | 2.33 | 0.622 | 6.95 | 10.07 | 0.861 |
| 16 | 1.73 | 720 | 1.55 | 2250 | 1.40 | 2200 | 2.33 | 0.7 | 7.04 | 11.5 | 2.33 | 0.633 | 6.86 | 10.13 | 0.881 |
| 17 | 1.73 | 675 | 1.55 | 2000 | 1.40 | 1800 | 2.33 | 0.7 | 6.87 | 11.22 | 2.33 | 0.64 | 6.72 | 10.03 | 0.894 |
| 18 | 1.73 | 1200 | 1.55 | 7500 | 1.20 | 3300 | 2.23 | 0.7 | 8.51 | 13.28 | 2.23 | 0.521 | 7.7 | 8.94 | 0.674 |
| 19 | 1.73 | 850 | 1.55 | 3000 | 1.20 | 700 | 2.23 | 0.7 | 7.49 | 11.69 | 2.23 | 0.633 | 7.3 | 10.3 | 0.881 |
| 20 | 1.73 | 820 | 1.55 | 2750 | 1.20 | 630 | 2.23 | 0.7 | 7.41 | 11.56 | 2.23 | 0.638 | 7.23 | 10.3 | 0.891 |
| 21 | 1.73 | 780 | 1.55 | 2500 | 1.20 | 580 | 2.23 | 0.7 | 7.3 | 11.43 | 2.23 | 0.643 | 7.14 | 10.23 | 0.895 |
| 22 | 1.73 | 750 | 1.55 | 2250 | 1.20 | 500 | 2.23 | 0.7 | 7.17 | 11.19 | 2.23 | 0.645 | 7.03 | 10.18 | 0.910 |
| 23 | 1.73 | 700 | 1.55 | 2000 | 1.20 | 450 | 2.23 | 0.7 | 6.95 | 10.92 | 2.23 | 0.657 | 6.83 | 10.01 | 0.917 |
| 24 | 1.73 | 1350 | 1.45 | 3000 | 1.20 | 1400 | 2.20 | 0.7 | 8.63 | 13.30 | 2.20 | 0.620 | 8.36 | 11.39 | 0.856 |
| 25 | 1.73 | 1150 | 1.45 | 2700 | 1.20 | 1300 | 2.20 | 0.7 | 8.42 | 12.96 | 2.20 | 0.629 | 8.19 | 11.33 | 0.874 |
| 26 | 1.73 | 700 | 1.45 | 1000 | 1.20 | 450 | 2.20 | 0.7 | 6.96 | 10.79 | 2.20 | 0.674 | 6.89 | 10.22 | 0.947 |

In Table 2, the value "Final/Initial" represents the stability of the device estimated after one year of exposure, and is a ratio equal to the final efficiency divided by the initial efficiency. Although it is desirable to design photovoltaic devices to have the maximum long-term efficiency, it may be more desirable to design the photovoltaic device to have the maximum final/initial ratio to ensure a high level of efficiency for the long term use of the device.

Many of the aforementioned advantages of the utilizing SiGe alloys in the intrinsic layers are evidenced from the data provided in Table 2. For example, although providing a thicker middle intrinsic layer results in a higher initial efficiency, it is readily apparent by comparing cases 18 and 19, that a device constructed with a thinner middle intrinsic layer will exhibit a higher final efficiency due to the higher level of stability that is achieved. Further, by comparing cases 8 and 9, it will be apparent that narrowing the bandgap of the middle intrinsic layer results in a higher initial efficiency and a higher final efficiency.

As apparent from Table 2, it can generally be expected that the long-term efficiency will be at least 80% of the initial efficiency when the thickness of the middle intrinsic layer is less than 3000 Å.

Device 400 may optionally include a second interface layer 411 of relatively low bandgap, high conductivity semiconductor material interposed between the n-type a-SiC:H layer 234 of photovoltaic cell 410 and the p-type a-SiC:H layer 422 of photovoltaic cell 412. Like first interface layer 240, second interface layer 411 has a lower bandgap than either of its adjacent layers 234 or 422 and can be provided as a p- or n-type semiconductor material that forms an ohmic contact with the adjacent one of layers 234 and 422 of the same conductivity type and that forms a tunnel junction with the one of layers 234 and 422 of the opposite conductivity type. Since layer 411 has a lower bandgap, it also has a higher electrical conductivity than either of adjacent layers 234 and 422. In general, while layers 234 and 422 can each have a bandgap on the order of 1.9 eV, the bandgap of layer 411 is preferably on the order of less than 1.7 eV.

Although the third embodiment has been described as including an interface layer 240 sandwiched between the first and second photovoltaic cells 210 and 410, it is considered within the scope of the present invention to form device 400 including second interface layer 411 formed between the second and third photovoltaic layers, but not including interface layer 240. However, given the benefits in providing interface layers between each junction of a multijunction photovoltaic device, it is preferable to include both interface layers 240 and 411.

Many variations of the third embodiment are possible in view of the number of possible combinations of the variations discussed above with respect to the first embodiment. For example, a multijunction device may be constructed in accordance with the third embodiment to include a first interface layer between first and second photovoltaic cells and a second interface layer formed between second and third photovoltaic cells, wherein the first interface layer is constructed in accordance with one variation of the first embodiment (e.g., interface layer 240 is provided as a p+-type hydrogenated amorphous silicon layer), and the second interface layer is constructed in accordance with another variation of the first embodiment (e.g., interface layer 411 is provided as a microcrystalline layer of n+-type hydrogenated silicon). Although further examples of the possible variations of the third embodiment are not provided herein, such variations are to be considered within the scope of the third embodiment.

One possible method for constructing the third embodiment is described next. In this regard, only the formation of layers 420 and 424 are described in detail. A suitable method for constructing the remainder of device 400 is disclosed above with respect to the first embodiment. Layers 411, 422, and 426 of device 400, which are not included in the first embodiment, may be constructed in a similar manner by which corresponding layers 240, 230, and 234 are respectively constructed as described above with respect to the first embodiment. Intrinsic layer 222 of the first photovoltaic cell typically is formed to have a thickness between 600 and 700 Å.

Similar to the construction of the first embodiment, all semiconductor layers of device 400 are formed by a glow discharge deposition process. Intrinsic layer 420 is deposited by dc or rf discharge to a thickness of about 1,500 to 2,500 Å using 25 sccm 20%GeH$_4$:H mixture+75 sccm SiH$_4$ using approximately 0.25 watts/in$^2$ at about 1.5 torr. Intrinsic layer 424 is deposited by dc or rf discharge to a thickness of about 1,500 to 2,500 Å using 50 sccm 20%GeH$_4$:H mixture+50 sccm SiH$_4$ using approximately 0.25 watts/in$^2$ at about 1.5 torr.

Figure 5:
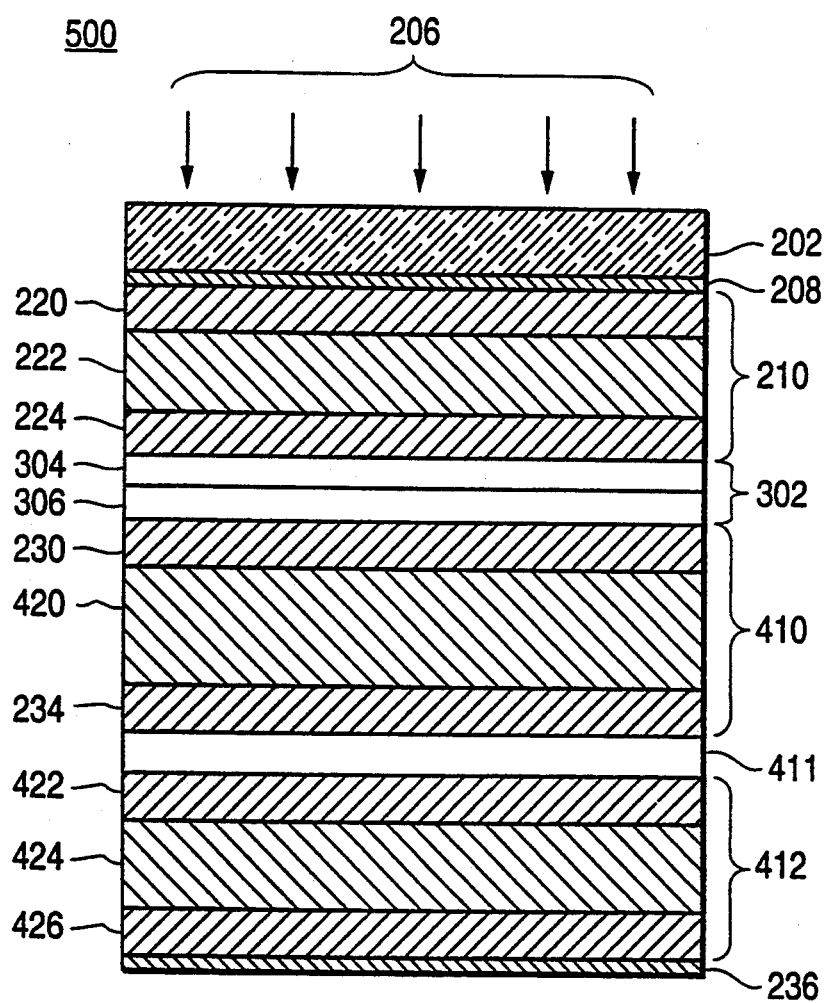
FIG. 5 is a cross-sectional view of an amorphous silicon multijunction photovoltaic device constructed in accordance with a fourth embodiment of the present invention.

FIG. 5 illustrates a multijunction photovoltaic device 500 constructed in accordance with a fourth embodiment of the invention. Device 500 includes substrate 202, front conductive layer 208, first photovoltaic cell 210, second photovoltaic cell 410, second interface layer 411, third photovoltaic cell 412, and back contact layer 236 as described above for device 400. The only difference between device 500 and device 400 of the third embodiment is that interface layer 240 has been replaced with interface layer 302 which is described above with respect to the second embodiment.

As described above in the second embodiment, interface layer 302 includes layer 304 and 306. Again, layers 304 and 306 may include any of the possible variations and combinations provided for in the second embodiment.

Many variations of the fourth embodiment are possible in view of the number of possible combinations of the variations discussed above with respect to interface layer 240, which also apply to interface layer 411, in the first embodiment, and the variations discussed above with respect to interface layer 302 in the second embodiment. For example, a multijunction device may be constructed in accordance with the fourth embodiment to include a first interface layer between first and second photovoltaic cells and a second interface layer formed between second and third photovoltaic cells, wherein the first interface layer is constructed in accordance with one of the variations of the second embodiment (e.g., layer 304 is provided as a microcrystalline layer of n+-type hydrogenated silicon, and layer 306 is provided as a layer of p+-type hydrogenated amorphous silicon), and the second interface layer is constructed in accordance with one of the variations of the first embodiment (e.g., interface layer 411 is provided as a microcrystalline layer of n+-type hydrogenated silicon). Although further examples of the possible variations of the fourth embodiment are not provided herein, such variations are to be considered within the scope of the fourth embodiment.

Figure 6:
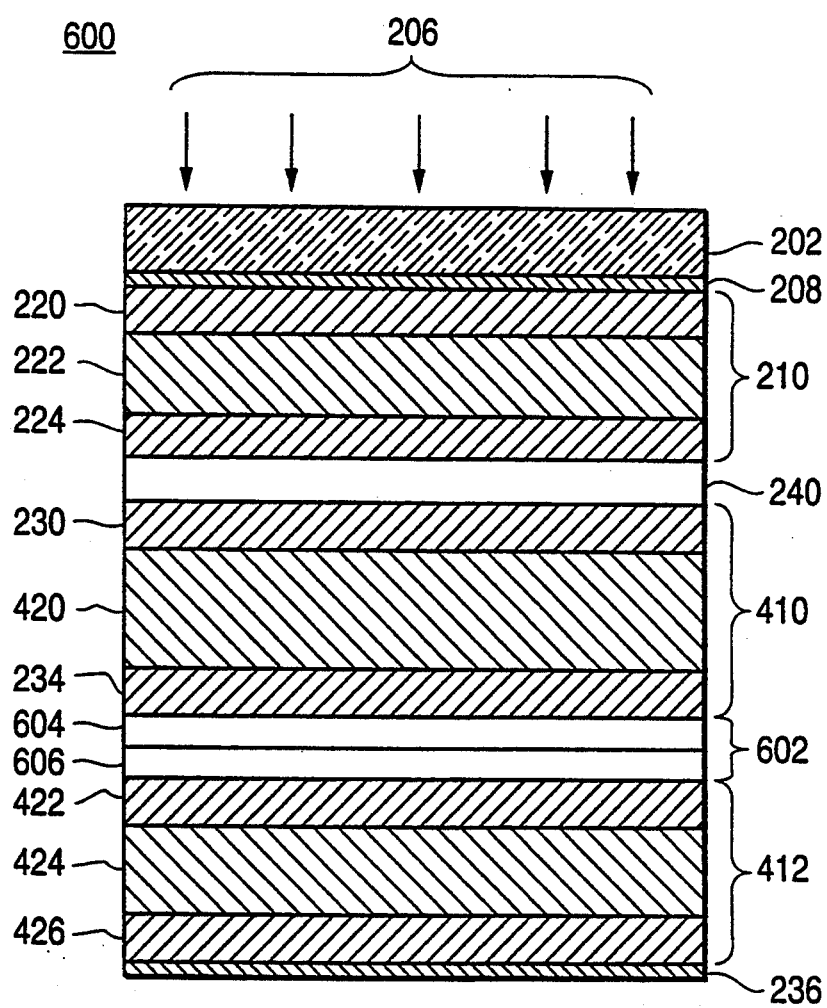
FIG. 6 is a cross-sectional view of an amorphous silicon multijunction photovoltaic device constructed in accordance with a fifth embodiment of the present invention.

FIG. 6 illustrates a multijunction photovoltaic device 600 constructed in accordance with a fifth embodiment of the invention. Device 600 includes substrate 202, front conductive layer 208, first photovoltaic cell 210, the first interface layer 240, second photovoltaic cell 410, third photovoltaic cell 412, and back contact layer 236 as described above for device 400. The only difference between device 600 and device 400 of the third embodiment is that interface layer 411 has been replaced with interface layer 602 which corresponds to interface layer 302 described above with respect to the second embodiment.

Like interface layer 302 of the second embodiment, interface layer 602 includes layers 604 and 606. Layers 604 and 606 may include any of the possible variations and combinations provided for in the second embodiment with respect to layers 304 and 306.

Many variations of the fifth embodiment are possible in view of the number of possible combinations of the variations discussed above with respect to interface layer 240 in the first embodiment, and the variations discussed above with respect to the second interface layer 602 which correspond to the variations of interface layer 302 in the second embodiment. For example, a multijunction device may be constructed in accordance with the fifth embodiment to include a first interface layer between first and second photovoltaic cells and a second interface layer formed between second and third photovoltaic cells, wherein the first interface layer is constructed in accordance with one of the variations of the first embodiment (e.g., interface layer 240 is provided as a p+-type hydrogenated amorphous silicon layer), and the second interface layer is constructed in accordance with one of the variations of the second embodiment (e.g., layer 604 is provided as a microcrystalline layer of n+-type hydrogenated silicon, and layer 606 is provided as a layer of p+-type hydrogenated amorphous silicon). Although further examples of the possible variations of the fifth embodiment are not provided herein, such variations are to be considered within the scope of the fifth embodiment.

Figure 7:
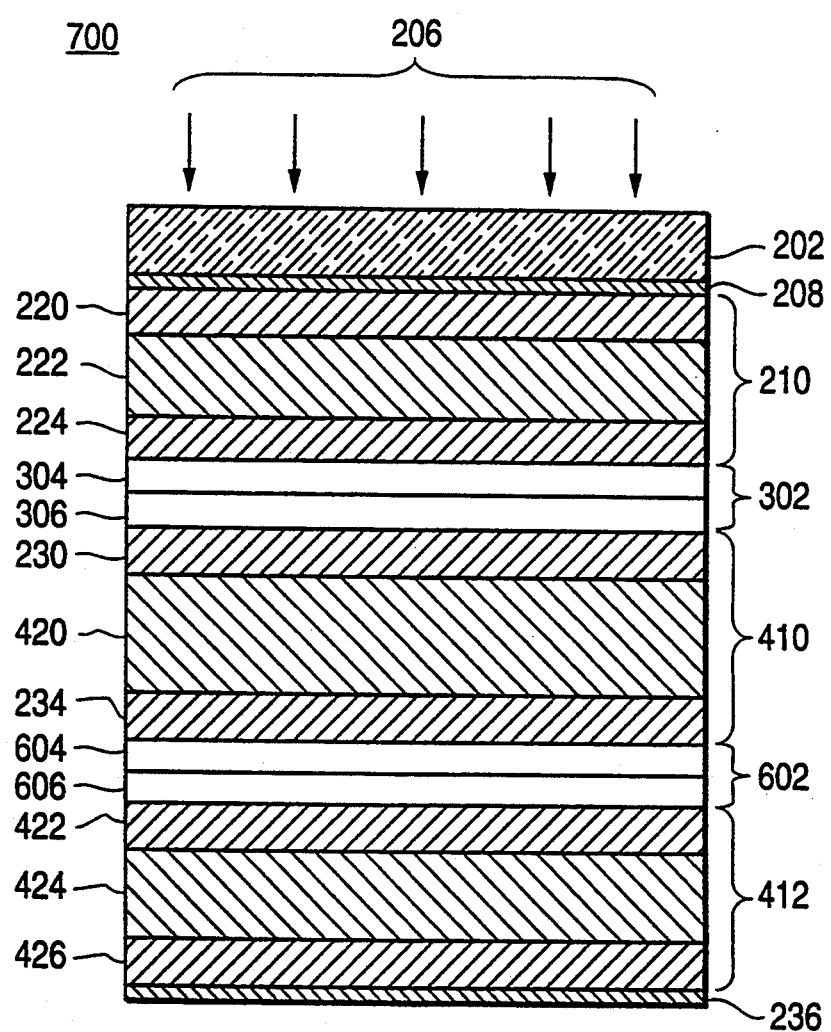
FIG. 7 is a cross-sectional view of an amorphous silicon multijunction photovoltaic device constructed in accordance with a sixth embodiment of the present invention.

FIG. 7 illustrates a multijunction photovoltaic device 700 constructed in accordance with a sixth embodiment of the invention. Device 700 includes substrate 202, front conductive layer 208, first photovoltaic cell 210, second photovoltaic cell 410, second interface layer 602, third photovoltaic cell 412, and back contact layer 236 as described above for device 600. The only difference between device 700 and device 600 of the fifth embodiment is that first interface layer 240 has been replaced with interface layer 302 which is described above with respect to the second embodiment.

Many variations of the sixth embodiment are possible in view of the number of possible combinations of the variations discussed above with respect to interface layer 302 in the second embodiment, and the variations discussed above with respect to the second interface layer 602 which also correspond to the variations of interface layer 302 in the second embodiment. For example, a multijunction device may be constructed in accordance with the sixth embodiment to include a first interface layer between first and second photovoltaic cells and a second interface layer formed between second and third photovoltaic cells, wherein the first interface layer is constructed in accordance with one of the variations of the second embodiment (e.g., layer 304 is provided as a layer of n+-type hydrogenated amorphous silicon, and layer 306 is provided as a layer of p+-type hydrogenated amorphous silicon), and the second interface layer is constructed in accordance with another variation of the second (e.g., layer 604 is provided as a microcrystalline layer of n+-type hydrogenated silicon, and layer 606 is provided as a layer of p+-type hydrogenated amorphous silicon). Although further examples of the possible variations of the sixth embodiment are not provided herein, such variations are to be considered within the scope of the sixth embodiment.

The foregoing description of the preferred embodiments and examples of the invention have been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A multijunction photovoltaic device, comprising:
   a transparent substrate;
   a transparent electrode formed on said transparent substrate;
   a first photovoltaic cell formed on said transparent electrode and comprising;
      a p-type layer formed adjacent said transparent electrode,
      an intrinsic layer of an amorphous semiconductor compound including silicon formed on said p-type layer, and
      an n-type layer formed on said intrinsic layer;
   an interface layer of a semiconductor compound including silicon formed on said n-type layer of said first photovoltaic cell, said interface layer having a bandgap less than the bandgap of said n-type layer of said first photovoltaic cell;
   a second photovoltaic cell formed on said interface layer and comprising,
      a p-type layer formed on said interface layer and having a bandgap greater than the bandgap of said interface layer,
      an intrinsic layer formed on said p-type layer, having a thickness less than 3000 Å, and being made of an amorphous semiconductor compound including silicon doped with germanium and having a bandgap less than the bandgap of said intrinsic layer of said first photovoltaic cell, and
      an n-type layer formed on said intrinsic layer;
   a third photovoltaic cell formed on said second photovoltaic cell and comprising,
      a p-type layer,
      an intrinsic layer of an amorphous semiconductor compound including silicon doped with germanium and having a bandgap less than the bandgap of said intrinsic layer of said second photovoltaic cell, formed on said p-type layer, and
      an n-type layer formed on said intrinsic layer; and
   a reflective electrode layer formed on said n-type layer of said third photovoltaic cell.

2. The multijunction device of claim 1, wherein the intrinsic layer of said first photovoltaic cell has a thickness between 600 and 700 Å.

3. The multijunction device of claim 1, wherein the intrinsic layer of said third photovoltaic cell has a thickness between 1,500 and 2,500 Å.

4. The multijunction device of claim 1, wherein the bandgap of said intrinsic layer of said first photovoltaic cell is between 1.7 and 1.99 eV.

5. The multijunction device of claim 1, wherein the bandgap of said intrinsic layer of said second photovoltaic cell is between 1.45 and 1.65 eV.

6. The multijunction device of claim 1, wherein the bandgap of said intrinsic layer of said third photovoltaic cell is between 1.20 and 1.45 eV.

7. The multijunction device of claim 1, wherein the bandgap of said intrinsic layer of said first photovoltaic cell is between 1.7 and 1.99 eV, the bandgap of said intrinsic layer of said second photovoltaic cell is between 1.45 and 1.65 eV, and the bandgap of said intrinsic layer of said third photovoltaic cell is between 1.20 and 1.45 eV.

8. The multijunction device of claim 1, wherein said interface layer is doped with a dopant of the n-type to form a tunnel junction with said p-type layer of said second photovoltaic cell and an ohmic contact with said n-type layer of said first photovoltaic cell.

9. The multijunction device of claim 8, wherein said n-type layer of said first photovoltaic cell and said p-type layer of said second photovoltaic cell further include an element selected from the group consisting of carbon, nitrogen, oxygen and fluorine; and
said interface layer being substantially free of carbon, nitrogen, oxygen, and fluorine.

10. The multijunction device of claim 1, wherein said interface layer is doped with a dopant of the p-type to form a tunnel junction with said n-type layer of said first photovoltaic cell and an ohmic contact with said p-type layer of said second photovoltaic cell.

11. The multijunction device of claim 1, further comprising a second interface layer of a semiconductor compound including silicon formed between said n-type layer of said second photovoltaic cell and said p-type layer of said third photovoltaic cell, said second interface layer having a bandgap less than the bandgaps of said n-type layer of said second photovoltaic cell and said p-type layer of said third photovoltaic cell.

12. A multijunction photovoltaic device comprising:
a transparent substrate;
a transparent electrode formed on said transparent substrate;
a first photovoltaic cell formed on said transparent electrode and comprising
a p-type layer formed adjacent said transparent electrode,
an intrinsic layer of an amorphous semiconductor compound including silicon formed on said p-type layer, and
an n-type layer formed on said intrinsic layer;
an interface layer of a semiconductor compound including silicon formed on said n-type layer of said first photovoltaic cell, said interface layer having a bandgap less than the bandgap of said n-type layer of said first photovoltaic cell;
a second photovoltaic cell formed on said interface layer and comprising
a p-type layer formed on said interface layer and having a bandgap greater than the bandgap of said interface layer,
an intrinsic layer formed on said p-type layer, and being made of an amorphous semiconductor compound including silicon doped with germanium and having a bandgap less than the bandgap of said intrinsic layer of said first photovoltaic cell, and
an n-type layer formed on said intrinsic layer;
a third photovoltaic cell formed on said second photovoltaic cell and comprising
a p-type layer,
an intrinsic layer of an amorphous semiconductor compound including silicon doped with germanium and having a bandgap less than the bandgap of said intrinsic layer of said second photovoltaic cell, formed on said p-type layer, and
an n-type layer formed on said intrinsic layer; and
a reflective electrode layer formed on said n-type layer of said third photovoltaic cell,
wherein said interface layer consists of first and second sublayers doped with a dopant of the n-type, said first sublayer consisting of an amorphous hydrogenated silicon compound and said second sublayer consisting of a microcrystalline hydrogenated silicon compound, said first sublayer forming an ohmic contact with said n-type layer of said first photovoltaic cell and said second sublayer forming a tunnel junction with said p-type layer of said second photovoltaic cell.

13. A multijunction photovoltaic device comprising:
a transparent substrate;
a transparent electrode formed on said transparent substrate;
a first photovoltaic cell formed on said transparent electrode and comprising
a p-type layer formed adjacent said transparent electrode,
an intrinsic layer of an amorphous semiconductor compound including silicon formed on said p-type layer, and
an n-type layer formed on said intrinsic layer;
an interface layer of a semiconductor compound including silicon formed on said n-type layer of said first photovoltaic cell, said interface layer having a bandgap less than the bandgap of said n-type layer of said first photovoltaic cell;
a second photovoltaic cell formed on said interface layer and comprising
a p-type layer formed on said interface layer and having a bandgap greater than the bandgap of said interface layer,
an intrinsic layer formed on said p-type layer, and being made of an amorphous semiconductor compound including silicon doped with germanium and having a bandgap less than the bandgap of said intrinsic layer of said first photovoltaic cell, and
an n-type layer formed on said intrinsic layer;
a third photovoltaic cell formed on said second photovoltaic cell and comprising
a p-type layer,
an intrinsic layer of an amorphous semiconductor compound including silicon doped with germanium and having a bandgap less than the bandgap of said intrinsic layer of said second photovoltaic cell, formed on said p-type layer, and
an n-type layer formed on said intrinsic layer; and
a reflective electrode layer formed on said n-type layer of said third photovoltaic cell,
wherein said interface layer consists of a first layer and a second layer, said first layer being doped with a dopant of the n-type and forming an ohmic contact with said n-type layer of said first photovoltaic cell, said second layer being doped with a dopant of the p-type and forming an ohmic contact with said p-type layer of said second photovoltaic cell, a tunnel junction being formed between said first and second layers.

14. The multijunction device of claim 13, wherein said first layer comprises a microcrystalline hydrogenated silicon compound and said second layer comprises an amorphous hydrogenated silicon compound.

15. The multijunction device of claim 13, wherein said first and second layers each comprise an amorphous hydrogenated silicon compound.

16. The multijunction device of claim 13, wherein said first and second layers each comprise a microcrystalline hydrogenated silicon compound.

17. The multijunction device of claim 13, wherein said first layer comprises an amorphous hydrogenated silicon compound and said second layer comprises a microcrystalline hydrogenated silicon compound.

18. A multijunction photovoltaic device, comprising:
a transparent substrate;
a transparent electrode formed on said transparent substrate;
a first photovoltaic cell formed on said transparent electrode and comprising;
a p-type layer formed adjacent said transparent electrode,
an intrinsic layer of an amorphous semiconductor compound including silicon formed on said p-type layer, and
an n-type layer formed on said intrinsic layer;
a second photovoltaic cell formed on said first photovoltaic cell and comprising,
a p-type layer,
an intrinsic layer formed on said p-type layer, having a thickness less than 3000 Å, and being made of an amorphous semiconductor compound including silicon doped with germanium and having a bandgap less than the bandgap of said intrinsic layer of said first photovoltaic cell, and
an n-type layer formed on said intrinsic layer;
an interface layer of a semiconductor compound including silicon formed on said n-type layer of said second photovoltaic cell, said interface layer having a bandgap less than the bandgap of said n-type layer of said second photovoltaic cell;
a third photovoltaic cell formed on said interface layer and comprising,
a p-type layer having a bandgap greater than the bandgap of said interface layer,
an intrinsic layer of an amorphous semiconductor compound including silicon doped with germanium and having a bandgap less than the bandgap of said intrinsic layer of said second photovoltaic cell, formed on said p-type layer, and
an n-type layer formed on said intrinsic layer; and
a reflective electrode layer formed on said n-type layer of said third photovoltaic cell.

19. The multijunction device of claim 18, wherein the intrinsic layer of said first photovoltaic cell has a thickness between 600 and 700 Å.

20. The multijunction device of claim 18, wherein the intrinsic layer of said third photovoltaic cell has a thickness between 1,500 and 2,500 Å.

21. The multijunction device of claim 18, wherein the bandgap of said intrinsic layer of said first photovoltaic cell is between 1.7 and 1.99 eV, the bandgap of said intrinsic layer of said second photovoltaic cell is between 1.45 and 1.65 eV, and the bandgap of said intrinsic layer of said third photovoltaic cell is between 1.20 and 1.45 eV.

22. The multijunction device of claim 18, wherein said interface layer is doped with a dopant of the n-type to form a tunnel junction with said p-type layer of said third photovoltaic cell and an ohmic contact with said n-type layer of said second photovoltaic cell.

23. The multijunction device of claim 22, wherein said n-type layer of said second photovoltaic cell and said p-type layer of said third photovoltaic cell further including an element selected from the group consisting of carbon, nitrogen, oxygen and fluorine; and
said interface layer being substantially free of carbon, nitrogen, oxygen and fluorine.

24. The multijunction device of claim 18, wherein said interface layer is doped with a dopant of the p-type to form a tunnel junction with said n-type layer of said second photovoltaic cell and an ohmic contact with said p-type layer of said third photovoltaic cell.

25. The multijunction device of claim 18, further comprising a second interface layer of a semiconductor compound including silicon formed between said n-type layer of said first photovoltaic cell and said p-type layer of said second photovoltaic cell, said second interface layer having a bandgap less than the bandgaps of said n-type layer of said first photovoltaic cell and said p-type layer of said second photovoltaic cell.

26. A multijunction photovoltaic device comprising:
a transparent substrate;
a transparent electrode formed on said transparent substrate;
a first photovoltaic cell formed on said transparent electrode and comprising:
a p-type layer formed adjacent said transparent electrode,
an intrinsic layer of an amorphous semiconductor compound including silicon formed on said p-type layer, and
an n-type layer formed on said intrinsic layer;
a second photovoltaic cell formed on said first photovoltaic cell and comprising:
a p-type layer,
an intrinsic layer formed on said p-type layer, and being made of an amorphous semiconductor compound including silicon doped with germanium and having a bandgap less than the bandgap of said intrinsic layer of said first photovoltaic cell, and
an n-type layer formed on said intrinsic layer;
an interface layer of a semiconductor compound including silicon formed on said n-type layer of said second photovoltaic cell, said interface layer having a bandgap less than the bandgap of said n-type layer of said second photovoltaic cell;
a third photovoltaic cell formed on said interface layer and comprising:
a p-type layer having a bandgap greater than the bandgap of said interface layer,
an intrinsic layer of an amorphous semiconductor compound including silicon doped with germanium and having a bandgap less than the bandgap of said intrinsic layer of said second photovoltaic cell, formed on said p-type layer, and
an n-type layer formed on said intrinsic layer; and
a reflective electrode layer formed on said n-type layer of said third photovoltaic cell,
wherein said interface layer consists of first and second sublayers doped with a dopant of the n-type, said first sublayer consisting of an amorphous hydrogenated silicon compound and said second sublayer consisting of a microcrystalline hydrogenated silicon compound, said first sublayer forming an ohmic contact with said n-type layer of said second photovoltaic cell and said second sublayer forming a tunnel junction with said p-type layer of said third photovoltaic cell.

27. A multijunction photovoltaic device comprising:
a transparent substrate;
a transparent electrode formed on said transparent substrate;
a first photovoltaic cell formed on said transparent electrode and comprising:
  a p-type layer formed adjacent said transparent electrode,
  an intrinsic layer of an amorphous semiconductor compound including silicon formed on said p-type layer, and
  an n-type layer formed on said intrinsic layer;
a second photovoltaic cell formed on said first photovoltaic cell and comprising:
  a p-type layer,
  an intrinsic layer formed on said p-type layer, and being made of an amorphous semiconductor compound including silicon doped with germanium and having a bandgap less than the bandgap of said intrinsic layer of said first photovoltaic cell, and
  an n-type layer formed on said intrinsic layer;
an interface layer of a semiconductor compound including silicon formed on said n-type layer of said second photovoltaic cell, said interface layer having a bandgap less than the bandgap of said n-type layer of said second photovoltaic cell;
a third photovoltaic cell formed on said interface layer and comprising:
  a p-type layer having a bandgap greater than the bandgap of said interface layer,
  an intrinsic layer of an amorphous semiconductor compound including silicon doped with germanium and having a bandgap less than the bandgap of said intrinsic layer of said second photovoltaic cell, formed on said p-type layer, and
  an n-type layer formed on said intrinsic layer; and
a reflective electrode layer formed on said n-type layer of said third photovoltaic cell,
wherein said interface layer consists of a first layer and a second layer, said first layer being doped with a dopant of the n-type and forming an ohmic contact with said n-type layer of said second photovoltaic cell, said second layer being doped with a dopant of the p-type and forming an ohmic contact with said p-type layer of said third photovoltaic cell, a tunnel junction being formed between said first and second layers.

28. The multijunction device of claim 27, wherein said first layer comprises a microcrystalline hydrogenated silicon compound and said second layer comprises an amorphous hydrogenated silicon compound.

29. The multijunction device of claim 27, wherein said first and second layers each comprise an amorphous hydrogenated silicon compound.

30. The multijunction device of claim 27, wherein said first and second layers each comprise an microcrystalline hydrogenated silicon compound.

31. The multijunction device of claim 27, wherein said first layer comprises an amorphous hydrogenated silicon compound and said second layer comprises a microcrystalline hydrogenated silicon compound.

32. A multijunction photovoltaic device, comprising:
a transparent substrate;
a transparent electrode formed on said transparent substrate;
a first photovoltaic cell formed on said transparent electrode and comprising;
  a p-type layer formed adjacent said transparent electrode,
  an intrinsic layer of an amorphous semiconductor compound including silicon formed on said p-type layer, and
  an n-type layer formed on said intrinsic layer;
a first interface layer of a semiconductor compound including silicon formed on said n-type layer of said first photovoltaic cell, said first interface layer having a bandgap less than the bandgap of said n-type layer of said first photovoltaic cell;
a second photovoltaic cell formed on said first interface layer and comprising,
  a p-type layer having a bandgap greater than the bandgap of said first interface layer,
  an intrinsic layer formed on said p-type layer, having a thickness less than 3000 Å, and being made of an amorphous semiconductor compound including silicon doped with germanium and having a bandgap less than the bandgap of said intrinsic layer of said first photovoltaic cell, and
  an n-type layer formed on said intrinsic layer;
a second interface layer of a semiconductor compound including silicon formed on said n-type layer of said second photovoltaic cell, said second interface layer having a bandgap less than the bandgap of said n-type layer of said second photovoltaic cell;
a third photovoltaic cell formed on said second interface layer and comprising,
  a p-type layer having a bandgap greater than the bandgap of said second interface layer,
  an intrinsic layer of an amorphous semiconductor compound including silicon doped with germanium and having a bandgap less than the bandgap of said intrinsic layer of said second photovoltaic cell, formed on said p-type layer, and
  an n-type layer formed on said intrinsic layer; and
a reflective electrode layer formed on said n-type layer of said third photovoltaic cell.

33. The multijunction device of claim 32, wherein the intrinsic layer of said first photovoltaic cell has a thickness between 600 and 700 Å.

34. The multijunction device of claim 32, wherein the intrinsic layer of said third photovoltaic cell has a thickness between 1,500 and 2,500 Å.

35. The multijunction device of claim 32, wherein the bandgap of said intrinsic layer of said first photovoltaic cell is between 1.7 and 1.99 eV, the bandgap of said intrinsic layer of said second photovoltaic cell is between 1.45 and 1.65 eV, and the bandgap of said intrinsic layer of said third photovoltaic cell is between 1.20 and 1.45 eV.

36. The multijunction device of claim 32, wherein said first interface layer is doped with a dopant of the n-type to form a tunnel junction with said p-type layer of said second photovoltaic cell and an ohmic contact with said n-type layer of said first photovoltaic cell.

37. The multijunction device of claim 36, wherein said n-type layer of said first photovoltaic cell and said p-type layer of said second photovoltaic cell further including an element selected from the group consisting of carbon, nitrogen, oxygen and fluorine; and said first interface layer being substantially free of carbon, nitrogen, oxygen and fluorine.

38. The multijunction device of claim 32, wherein said first interface layer is doped with a dopant of the p-type to form a tunnel junction with said n-type layer of said first photovoltaic cell and an ohmic contact with said p-type layer of said second photovoltaic cell.

39. The multijunction device of claim 32, wherein said second interface layer is doped with a dopant of the n-type to form a tunnel junction with said p-type layer of said third photovoltaic cell and an ohmic contact with said n-type layer of said second photovoltaic cell.

40. The multijunction device of claim 39, wherein said n-type layer of said second photovoltaic cell and said p-type layer of said third photovoltaic cell further including an element selected from the group consisting of carbon, nitrogen, oxygen and fluorine; and said interface layer being substantially free of carbon, nitrogen, oxygen and fluorine.

41. The multijunction device of claim 32, wherein said second interface layer is doped with a dopant of the p-type to form a tunnel junction with said n-type layer of said second photovoltaic cell and an ohmic contact with said p-type layer of said third photovoltaic cell.

42. A multijunction photovoltaic device comprising:
a transparent substrate;
a transparent electrode formed on said transparent substrate;
a first photovoltaic cell formed on said transparent electrode and comprising:
  a p-type layer formed adjacent said transparent electrode,
  an intrinsic layer of an amorphous semiconductor compound including silicon formed on said p-type layer, and
  an n-type layer formed on said intrinsic layer;
a first interface layer of a semiconductor compound including silicon formed on said n-type layer of said first photovoltaic cell, said first interface layer having a bandgap less than the bandgap of said n-type layer of said first photovoltaic cell;
a second photovoltaic cell formed on said first interface layer and comprising:
  a p-type layer having a bandgap greater than the bandgap of said first interface layer,
  an intrinsic layer formed on said p-type layer, and being made of an amorphous semiconductor compound including silicon doped with germanium and having a bandgap less than the bandgap of said intrinsic layer of said first photovoltaic cell, and
  an n-type layer formed on said intrinsic layer;
a second interface layer of a semiconductor compound including silicon formed on said n-type layer of said second photovoltaic cell, said second interface layer having a bandgap less than the bandgap of said n-type layer of said second photovoltaic cell;
a third photovoltaic cell formed on said second interface layer and comprising:
  a p-type layer having a bandgap greater than the bandgap of said second interface layer,
  an intrinsic layer of an amorphous semiconductor compound including silicon doped with germanium and having a bandgap less than the bandgap of said intrinsic layer of said second photovoltaic cell, formed on said p-type layer, and
  an n-type layer formed on said intrinsic layer; and
a reflective electrode layer formed on said n-type layer of said third photovoltaic cell,
wherein said first interface layer consists of first and second sublayers doped with a dopant of the n-type, said first sublayer consisting of an amorphous hydrogenated silicon compound and said second sublayer consisting of a microcrystalline hydrogenated silicon compound, said first sublayer forming an ohmic contact with said n-type layer of said first photovoltaic cell and said second sublayer forming a tunnel junction with said p-type layer of said second photovoltaic cell.

43. A multijunction photovoltaic device comprising:
a transparent substrate;
a transparent electrode formed on said transparent substrate;
a first photovoltaic cell formed on said transparent electrode and comprising:
  a p-type layer formed adjacent said transparent electrode,
  an intrinsic layer of an amorphous semiconductor compound including silicon formed on said p-type layer, and
  an n-type layer formed on said intrinsic layer;
a first interface layer of a semiconductor compound including silicon formed on said n-type layer of said first photovoltaic cell, said first interface layer having a bandgap less than the bandgap of said n-type layer of said first photovoltaic cell;
a second photovoltaic cell formed on said first interface layer and comprising:
  a p-type layer having a bandgap greater than the bandgap of said first interface layer,
  an intrinsic layer formed on said p-type layer, and being made of an amorphous semiconductor compound including silicon doped with germanium and having a bandgap less than the bandgap of said intrinsic layer of said first photovoltaic cell, and
  an n-type layer formed on said intrinsic layer;
a second interface layer of a semiconductor compound including silicon formed on said n-type layer of said second photovoltaic cell, said second interface layer having a bandgap less than the bandgap of said n-type layer of said second photovoltaic cell;
a third photovoltaic cell formed on said second interface layer and comprising:
  a p-type layer having a bandgap greater than the bandgap of said second interface layer,
  an intrinsic layer of an amorphous semiconductor compound including silicon doped with germanium and having a bandgap less than the bandgap of said intrinsic layer of said second photovoltaic cell, formed on said p-type layer, and
  an n-type layer formed on said intrinsic layer; and
a reflective electrode layer formed on said n-type layer of said third photovoltaic cell,
wherein said first interface layer consists of a first layer and a second layer, said first layer being doped with a dopant of the n-type and forming an ohmic contact with said n-type layer of said first photovoltaic cell, said second layer being doped with a dopant of the p-type and forming an ohmic contact with said p-type layer of said second photovoltaic cell, a tunnel junction being formed between said first and second layers.

44. The multijunction device of claim 43, wherein said first layer comprises a microcrystalline hydrogenated silicon compound and said second layer comprises an amorphous hydrogenated silicon compound.

45. The multijunction device of claim 43, wherein said first and second layers each comprise an amorphous hydrogenated silicon compound.

46. The multijunction device of claim 43, wherein said first and second layers each comprise an microcrystalline hydrogenated silicon compound.

47. The multijunction device of claim 43, wherein said first layer comprises an amorphous hydrogenated silicon compound and said second layer comprises a microcrystalline hydrogenated silicon compound.

48. A multijunction photovoltaic device comprising:
a transparent substrate;
a transparent electrode formed on said transparent substrate;
a first photovoltaic cell formed on said transparent electrode and comprising:
    a p-type layer formed adjacent said transparent electrode,
    an intrinsic layer of an amorphous semiconductor compound including silicon formed on said p-type layer, and
    an n-type layer formed on said intrinsic layer;
a first interface layer of a semiconductor compound including silicon formed on said n-type layer of said first photovoltaic cell, said first interface layer having a bandgap less than the bandgap of said n-type layer of said first photovoltaic cell;
a second photovoltaic cell formed on said first interface layer and comprising:
    a p-type layer having a bandgap greater than the bandgap of said first interface layer,
    an intrinsic layer formed on said p-type layer, and being made of an amorphous semiconductor compound including silicon doped with germanium and having a bandgap less than the bandgap of said intrinsic layer of said first photovoltaic cell, and
    an n-type layer formed on said intrinsic layer;
a second interface layer of a semiconductor compound including silicon formed on said n-type layer of said second photovoltaic cell, said second interface layer having a bandgap less than the bandgap of said n-type layer of said second photovoltaic cell;
a third photovoltaic cell formed on said second interface layer and comprising:
    a p-type layer having a bandgap greater than the bandgap of said second interface layer,
    an intrinsic layer of an amorphous semiconductor compound including silicon doped with germanium and having a bandgap less than the bandgap of said intrinsic layer of said second photovoltaic cell, formed on said p-type layer, and
    an n-type layer formed on said intrinsic layer; and
a reflective electrode layer formed on said n-type layer of said third photovoltaic cell,
wherein said second interface layer consists of first and second sublayers doped with a dopant of the n-type, said first sublayer consisting of an amorphous hydrogenated silicon compound and said second sublayer consisting of a microcrystalline hydrogenated silicon compound, said first sublayer forming an ohmic contact with said n-type layer of said second photovoltaic cell and said second sublayer forming a tunnel junction with said p-type layer of said third photovoltaic cell.

49. A multijunction photovoltaic device comprising:
a transparent substrate;
a transparent electrode formed on said transparent substrate;
a first photovoltaic cell formed on said transparent electrode and comprising:
    a p-type layer formed adjacent said transparent electrode,
    an intrinsic layer of an amorphous semiconductor compound including silicon formed on said p-type layer, and
    an n-type layer formed on said intrinsic layer;
a first interface layer of a semiconductor compound including silicon formed on said n-type layer of said first photovoltaic cell, said first interface layer having a bandgap less than the bandgap of said n-type layer of said first photovoltaic cell;
a second photovoltaic cell formed on said first interface layer and comprising:
    a p-type layer having a bandgap greater than the bandgap of said first interface layer,
    an intrinsic layer formed on said p-type layer, and being made of an amorphous semiconductor compound including silicon doped with germanium and having a bandgap less than the bandgap of said intrinsic layer of said first photovoltaic cell, and
    an n-type layer formed on said intrinsic layer;
a second interface layer of a semiconductor compound including silicon formed on said n-type layer of said second photovoltaic cell, said second interface layer having a bandgap less than the bandgap of said n-type layer of said second photovoltaic cell;
a third photovoltaic cell formed on said second interface layer and comprising:
    a p-type layer having a bandgap greater than the bandgap of said second interface layer,
    an intrinsic layer of an amorphous semiconductor compound including silicon doped with germanium and having a bandgap less than the bandgap of said intrinsic layer of said second photovoltaic cell, formed on said p-type layer, and
    an n-type layer formed on said intrinsic layer; and
a reflective electrode layer formed on said n-type layer of said third photovoltaic cell,
wherein said second interface layer consists of a first layer and a second layer, said first layer being doped with a dopant of the n-type and forming an ohmic contact with said n-type layer of said second photovoltaic cell, said second layer being doped with a dopant of the p-type and forming an ohmic contact with said p-type layer of said third photovoltaic cell, a tunnel junction being formed between said first and second layers.

50. The multijunction device of claim 49, wherein said first layer comprises a microcrystalline hydrogenated silicon compound and said second layer comprises an amorphous hydrogenated silicon compound.

51. The multijunction device of claim 49, wherein said first and second layers each comprise an amorphous hydrogenated silicon compound.

52. The multijunction device of claim 49, wherein said first and second layers each comprise an microcrystalline hydrogenated silicon compound.

53. The multijunction device of claim 49, wherein said first layer comprises an amorphous hydrogenated silicon compound and said second layer comprises a microcrystalline hydrogenated silicon compound.

54. A multijunction photovoltaic device, comprising:
a transparent substrate;
a transparent electrode formed on said transparent substrate;
a first photovoltaic cell formed on said transparent electrode and comprising;
  a p-type layer formed adjacent said transparent electrode,
  an intrinsic layer of an amorphous semiconductor compound including silicon formed on said p-type layer, and
  an n-type layer formed on said intrinsic layer;
a second photovoltaic cell formed on said first photovoltaic cell and comprising,
  a p-type layer,
  an intrinsic layer formed on said p-type layer, having a thickness less than 3000 Å, and being made of an amorphous semiconductor compound including silicon doped with germanium and having a bandgap less than the bandgap of said intrinsic layer of said first photovoltaic cell, and
  an n-type layer formed on said intrinsic layer;
a third photovoltaic cell formed on said second photovoltaic cell and comprising,
  a p-type layer,
  an intrinsic layer of an amorphous semiconductor compound including silicon doped with germanium and having a bandgap less than the bandgap of said intrinsic layer of said second photovoltaic cell, formed on said p-type layer, and
  an n-type layer formed on said intrinsic layer; and
a reflective electrode layer formed on said n-type layer of said third photovoltaic cell.

55. The multijunction device of claim 54, wherein the bandgap of said intrinsic layer of said first photovoltaic cell is between 1.7 and 1.99 eV, the bandgap of said intrinsic layer of said second photovoltaic cell is between 1.45 and 1.65 eV, and the bandgap of said intrinsic layer of said third photovoltaic cell is between 1.20 and 1.45 eV.

56. The multijunction device of claim 54, further comprising an interface layer of a semiconductor compound including silicon formed between said n-type layer of said first photovoltaic cell and said p-type layer of said second photovoltaic cell, said interface layer having a bandgap less than the bandgaps of said n-type layer of said first photovoltaic cell and said p-type layer of said second photovoltaic cell.

57. The multijunction device of claim 59, further comprising a second interface layer of a semiconductor compound including silicon formed between said n-type layer of said second photovoltaic cell and said p-type layer of said third photovoltaic cell, said second interface layer having a bandgap less than the bandgaps of said n-type layer of said second photovoltaic cell and said p-type layer of said third photovoltaic cell.

58. The multijunction device of claim 54, further comprising an interface layer of a semiconductor compound including silicon formed between said n-type layer of said second photovoltaic cell and said p-type layer of said third photovoltaic cell, said interface layer having a bandgap less than the bandgaps of said n-type layer of said second photovoltaic cell and said p-type layer of said third photovoltaic cell.

* * * * *